United States Patent
Choi et al.

(10) Patent No.: US 7,110,316 B2
(45) Date of Patent: Sep. 19, 2006

(54) SHARED DECOUPLING CAPACITANCE

(75) Inventors: Hyung-Chan Choi, Suwon-Si (KR);
Chi-Wook Kim, Gyeonggi-Do (KR);
Byung-Hoon Jeong, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 220 days.

(21) Appl. No.: 10/951,053

(22) Filed: Sep. 27, 2004

(65) Prior Publication Data

US 2005/0281114 A1 Dec. 22, 2005

(30) Foreign Application Priority Data

Jun. 18, 2004 (KR) ...................... 10-2004-0045429

(51) Int. Cl.
*G11C 5/14* (2006.01)
(52) U.S. Cl. ............. 365/226; 365/189.05; 365/189.11
(58) Field of Classification Search ................ 365/226, 365/189.05, 189.11, 204
See application file for complete search history.

(56) References Cited

U.S. PATENT DOCUMENTS

| | | | |
|---|---|---|---|
| 6,535,075 B1 | 3/2003 | Frech et al. ................ | 333/17.1 |
| 2006/0050589 A1* | 3/2006 | Choi et al. .................. | 365/226 |

OTHER PUBLICATIONS

Korean Patent Application No. P2000-0037234 to Lee, having Application date of Jun. 30, 2000 (English translation) with title "Reservoir Capacitance Control Device of a Semiconductor Memory Device".

* cited by examiner

*Primary Examiner*—Richard Elms
*Assistant Examiner*—Hien Nguyen
(74) *Attorney, Agent, or Firm*—Monica H. Choi

(57) ABSTRACT

Decoupling capacitance of at least one shared capacitor is distributed among a plurality of voltage sources for enhanced performance with minimized area of a semiconductor device. The high nodes and the low nodes of such voltage sources each comprise at least two distinct nodes for lower noise at the voltage sources. The present invention is applied to particular advantage for coupling a variable number of shared capacitors to a data charge voltage source depending on a bit organization of the semiconductor device.

35 Claims, 20 Drawing Sheets

INTERNAL POWER SUPPLY VOLTAGES

EXTERNAL POWER SUPPLY VOLTAGES

SHARED DECOUPLING CAPACITANCE

CROSS-REFERENCE TO RELATED APPLICATION(S)

The present application claims priority under 35 U.S.C. §119 to Korean Patent Application No. P2004-0045429, filed on Jun. 18, 2004, which is incorporated herein by reference in its entirety.

TECHNICAL FIELD

The present invention relates generally to power for semiconductor devices, and more particularly, to an apparatus for distributing decoupling capacitance between voltage sources in a semiconductor device.

BACKGROUND OF THE INVENTION

FIG. 1 shows an example semiconductor device 102 that is a memory device such as a DRAM (dynamic random access memory). The DRAM 102 includes an array of memory cells 104. Each memory cell such as an example memory cell 106 is coupled to a corresponding word line 108 and a corresponding bit line 110. Typically, a row of memory cells are coupled to a same word line, and a column of memory cells are coupled to a same bit line.

The DRAM 102 also includes an address input buffer 112 that receives an address corresponding to a memory cell to be accessed within the array 104. A column address (CA) is decoded by a column decoder 114 for activating a bit line corresponding to such a memory cell to be accessed. A row address (RA) is decoded by a row decoder 116 for activating a word line corresponding to such a memory cell to be accessed.

A sense amplifier 118 amplifies a signal from a read memory cell before such data is output via an I/O buffer 120 as output data DQ. When the memory device 102 is a synchronous device, a synchronized clock signal CLKDQ is generated by a delay locked loop (DLL) 122 (or a phase locked loop (PLL)) from an external clock signal CLK. The synchronized clock signal CLKDQ is used by the I/O buffer 120 for timing of the output data DQ.

A command decoder 124 decodes external command signals for generating internal command signals such as "active", "write", "read", "refresh", and "MRS (mode register set)" commands for controlling operations within the array of memory cells 104. Such commands with corresponding operations within the array of memory cells 104 are known to one of ordinary skill in the art.

The above described components of the memory device 102 derive power from various voltage sources. The memory device 102 uses both external voltages provided from external voltage sources and internal voltages generated internally by an internal voltage generator 126.

Referring to FIGS. 1 and 2, each of such voltage sources has a respective decoupling capacitor coupled between a respective pair of high and low nodes. A first decoupling capacitor 132 is coupled between high and low nodes VDD and VSS of a first voltage source. Such a voltage source is typically used for a peripheral circuit providing data paths from the array 104.

A second decoupling capacitor 134 is coupled between high and low nodes VDDQ and VSSQ of a second voltage source. Such a voltage source is typically used within the I/O buffer 120 for charging/discharging of the outputs DQ. A third decoupling capacitor 136 is coupled between high and low nodes VDDA and VSSA of a third voltage source. Such a voltage source is typically used within the array of memory cells 104 and for the sense amplifier 118.

A fourth decoupling capacitor 138 is coupled between high and low nodes VDDL and VSSL of a fourth voltage source. Such a voltage source is typically used by the delay locked loop 122. Such decoupling capacitors 132, 134, 136, and 138 are formed for the external voltage sources VDD/VSS, VDDQ/VSSQ, VDDA/VSSA, and VDDL/VSSL.

A fifth decoupling capacitor 140 is coupled between high and low nodes VINT and VSS of a fifth voltage source. Such voltages are internally generated by the voltage generator 126 for the peripheral circuit outside of the array of memory cells 104. A sixth decoupling capacitor 142 is coupled between high and low nodes VINTA and VSSA of a sixth voltage source. Such voltages are internally generated by the voltage generator 126 to be used within the array of memory cells 104.

A seventh decoupling capacitor 144 is coupled between high and low nodes VPP and VSS of a seventh voltage source. Such voltages are internally generated by the voltage generator 126 as a word line boosting voltage or as a gate voltage for isolation and equalization units within the array of memory cells 104.

An eighth decoupling capacitor 146 is coupled between high and low nodes VBB and VSS of an eighth voltage source. Such voltages are internally generated by the voltage generator 126 as a back bias for a cell access transistor or as a word line pre-charge voltage within the array of memory cells 104. Such decoupling capacitors 140, 142, 144, and 146 are formed for the internally generated voltage sources VINT/VSS, VINTA/VSSA, VPP/VSS, and VBB/VSS.

The decoupling capacitors 132, 134, 136, 138, 140, 142, 144, and 146 are fabricated as part of the integrated circuit of the semiconductor device 102. The capacitance of each of such decoupling capacitors is desired to be large for more stable operation of the semiconductor device.

For example, FIG. 3 shows an example I/O buffer 120 having a pull-up transistor MP1 and a pull-down transistor MN1 coupled between the nodes VDDQ and VSSQ. The sense amplifier 118 provides control signals DATA_UP and DATA_DN to turn on one of the transistors MP1 and MN1. FIG. 4 shows a timing diagram of operation of the I/O buffer 120 of FIG. 3.

Referring to FIGS. 3 and 4, during a charging time period 152, the pull-up transistor MP1 is turned on to charge the output DQ to the high voltage VDDQ. Thereafter during a discharging time period 154, the pull-down transistor MN1 is turned on to discharge the output DQ to the low voltage VSSQ. During such charging/discharging time periods 152 and 154, the voltage levels at the two nodes VDDQ and VSSQ deviate from the intended levels. Because of such a deviation, the DQ signal has undesired jitters during the charging/discharging time periods 152 and 154.

The undesired deviations of VDDQ and VSSQ and the undesired jitters of the DQ signal during the charging/discharging time periods 152 and 154 are minimized with higher capacitance of the decoupling capacitor 134 coupled between VDDQ and VSSQ. Similarly, the capacitance of each of the decoupling capacitors 132, 134, 136, 138, 140, 142, 144, and 146 is desired to be large for more stable operation of the semiconductor device 102. However, larger capacitance for such decoupling capacitors undesirably increases the area of the integrated circuit of the semiconductor device 102.

Referring to FIG. 5, Korean Patent Application No. P2000-0037234 discloses a capacitance control section 30 for coupling a control capacitor 10 to one of a first voltage source Vext and a second voltage source Vdd. The voltage levels Vext and Vdd are with respect to a same ground node 162 in FIG. 5.

Further referring to FIG. 5, the control section 30 includes a first PMOSFET PM2 coupled between Vext and the control capacitor 10 and includes a second PMOSFET PM3 coupled between Vdd and the control capacitor 10. The first PMOSFET PM2 has a gate coupled to a SEL (select) signal, and the second PMOSFET PM3 has a gate coupled to the SEL signal through an inverter IV5.

FIG. 6 shows a timing diagram for operation of the control section 30 of FIG. 5. During a first time period 164 and a third time period 168, the SEL signal is a logical high state for turning on the second PMOSFET PM3 to couple the control capacitor 10 to Vdd for a pre-charge operation of a memory device. During a second time period 166, the SEL signal is a logical low state for turning on the first PMOSFET PM2 to couple the control capacitor 10 to Vext for a read operation of the memory device.

Unfortunately, in the prior art of FIGS. 5 and 6, the voltage sources Vext and Vdd are with respect to a same ground node 162, resulting in higher noise. In addition in the prior art of FIGS. 5 and 6, distribution of capacitance of the control capacitor 10 is varied among voltages Vext and Vdd during operation of the memory device depending on the operation mode of the memory device. However, such distribution may not necessarily result in best performance of the memory device.

Thus, an alternative mechanism for distributing capacitance of a shared capacitor is desired for lower noise and higher performance of a semiconductor device.

SUMMARY OF THE INVENTION

In one embodiment of the present invention, each of a plurality of voltage sources used by a semiconductor device is coupled between respective high and low nodes. The high nodes of the voltage sources include at least two distinct nodes, and the low nodes of the voltage sources include at least two distinct nodes. In addition, a switching network is coupled to the voltage sources and to at least one shared capacitor for coupling the shared capacitor to the respective high and low nodes for a selected one of the voltage sources. Such distinct high nodes and low nodes for the voltage sources result in lower noise at the voltage sources.

In another embodiment of the present invention, the switching network is comprised of a plurality of transistors that are each turned on or off with control signals. A fuse within a fuse circuit is cut or not cut for determining the selected one of the voltage sources during a wafer stage for manufacture of the semiconductor device.

Alternatively, when the shared capacitor and the switching network are part of a memory device, the control signals are generated by a MRS (mode register set) decoder of the memory device. In that case, a memory controller is programmed to provide signals to the MRS decoder for determining the selected one of the voltage sources during a wafer stage or a package stage for manufacturing the memory device.

In a further embodiment of the present invention, a bonding pad is biased or floated within a bonding pad circuit for determining the selected one of the voltage sources during a wafer stage for manufacture of the semiconductor device.

In this manner, the selected one of the voltage sources is determined for enhanced performance of the semiconductor device during testing. The coupling of the shared capacitor to the selected one of the voltage sources is then set during the wafer stage or the package stage before typical operation of the semiconductor device by a customer.

In another embodiment of the present invention, a data charge voltage source is used for charging at least one output of a semiconductor device having a plurality of shared capacitors. A switching network couples a variable number of the shared capacitors to the data charge voltage source depending on a bit organization of the semiconductor device. In this manner, a higher decoupling capacitance is coupled to the data charge voltage source for the bit organization with a higher number of output pins.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15A, 15B, 15C, 16, 17, 18, 19A, 19B, 20, 21, 22A, 22B, 23, 24, and 25 refer to elements having similar structure and function.

DETAILED DESCRIPTION

Figure 7:
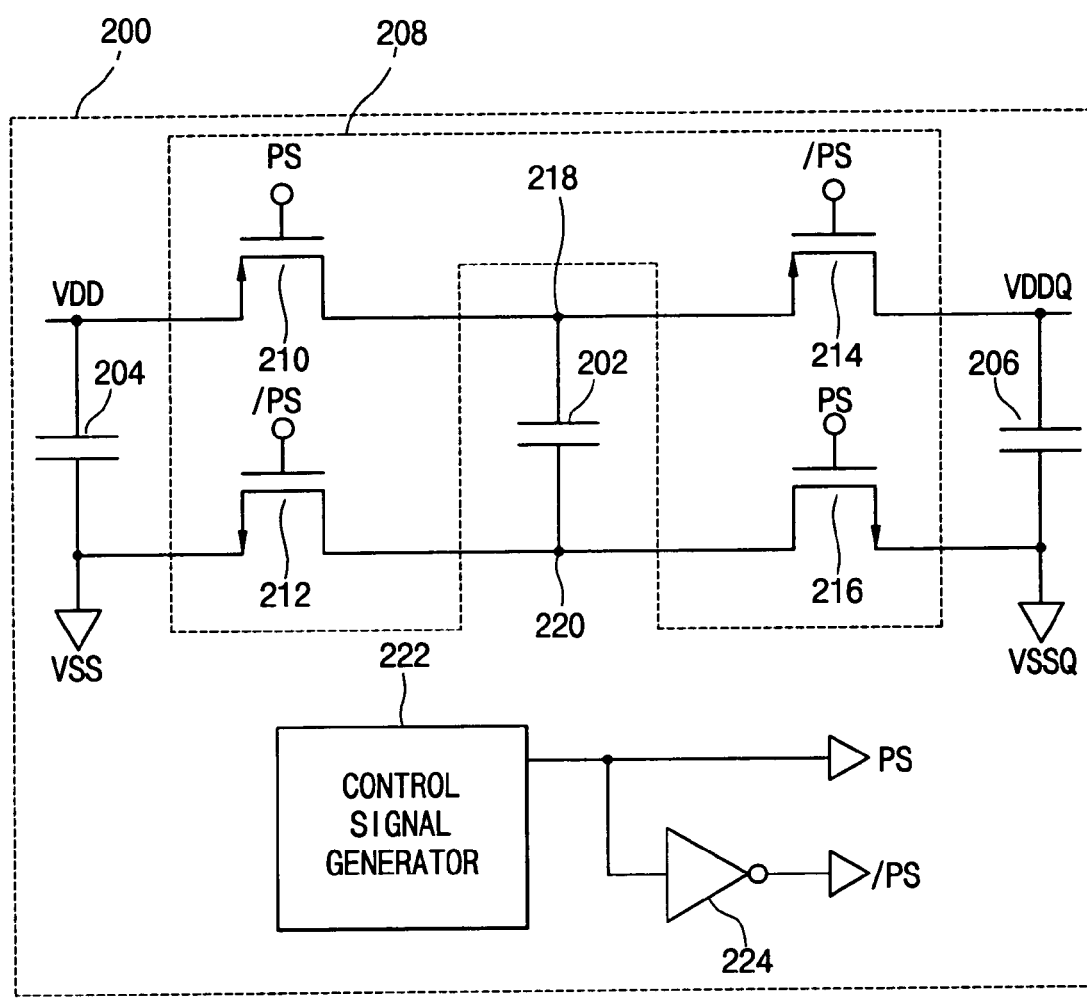
FIG. 7 shows a circuit diagram of a switching network for distributing a shared capacitance among voltage sources of a semiconductor device, according to an embodiment of the present invention.

FIG. 7 shows an apparatus 200 for providing a plurality of voltages with distribution of the capacitance of a shared capacitor 202 between the voltages. A first voltage source has a first initial decoupling capacitor 204 coupled between high and low nodes VDD/VSS. In addition, a second voltage source has a second initial decoupling capacitor 206 coupled between high and low nodes VDDQ/VSSQ. The high nodes VDD and VDDQ are two distinctly different nodes, and the low nodes VSS and VSSQ are two distinctly different nodes, in one embodiment of the present invention.

Further referring to FIG. 7, the apparatus 200 includes a switching network 208 coupled between the voltage sources VDD/VSS and VDDQ/VSSQ and the shared capacitor 202. The switching network 208 includes a first PMOSFET 210 coupled between the first high node VDD and a first node 218 of the shared capacitor 202. A first NMOSFET 212 is coupled between the first low node VSS and a second node 220 of the shared capacitor 202. A second PMOSFET 214 is coupled between the second high node VDDQ and the first node 218 of the shared capacitor 202. A second NMOSFET 216 is coupled between the second low node VSSQ and the second node 220 of the shared capacitor 202.

The gates of the first PMOSFET 210 and the second NMSOFET 216 are coupled to a first control signal PS (power select). The gates of the first NMOSFET 212 and the second PMOSFET 214 are coupled to a second control signal /PS that is a complement of the first control signal PS. Further referring to FIG. 7, the apparatus 200 includes a control signal generator 222 for generating the first control signal PS and an inverter 224 for generating the second control signal /PS.

Figure 1:
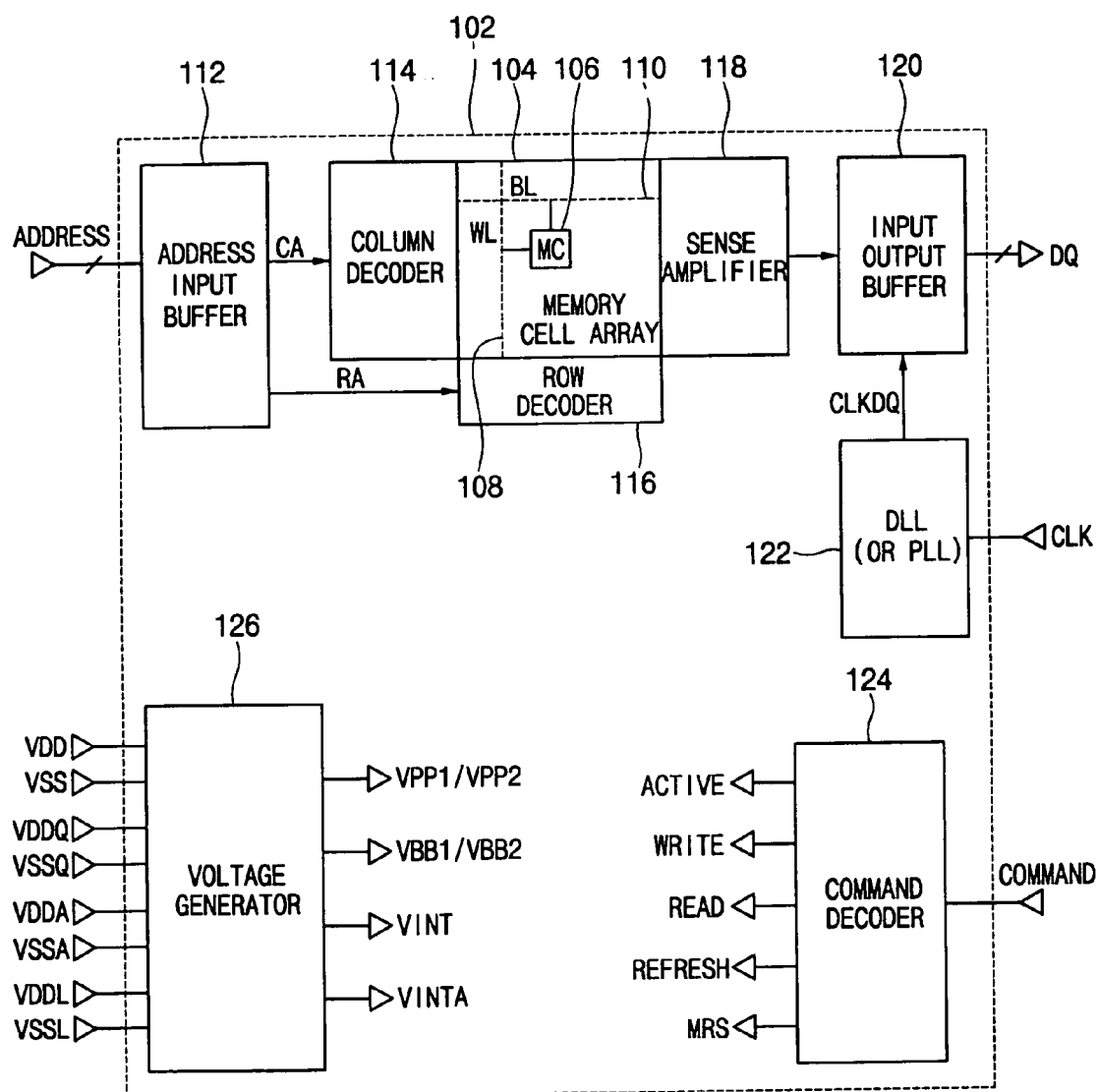
FIG. 1 shows a block diagram of a memory device such as a DRAM (dynamic random access memory) as known in the prior art.
Figure 2:
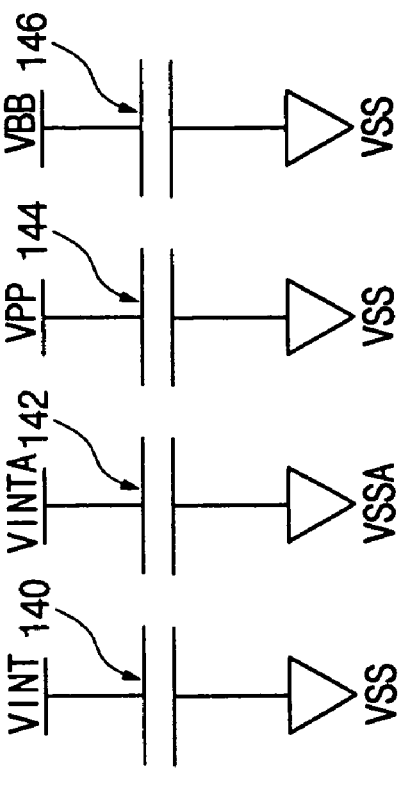
FIG. 2 shows a respective decoupling capacitor coupled across respective high and low nodes of each of a plurality of voltage sources for the memory device of FIG. 1, according to the prior art.
Figure 2:
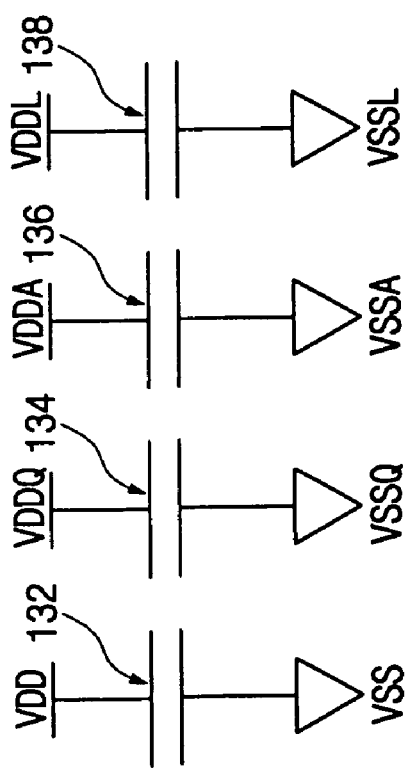
Figure 3:
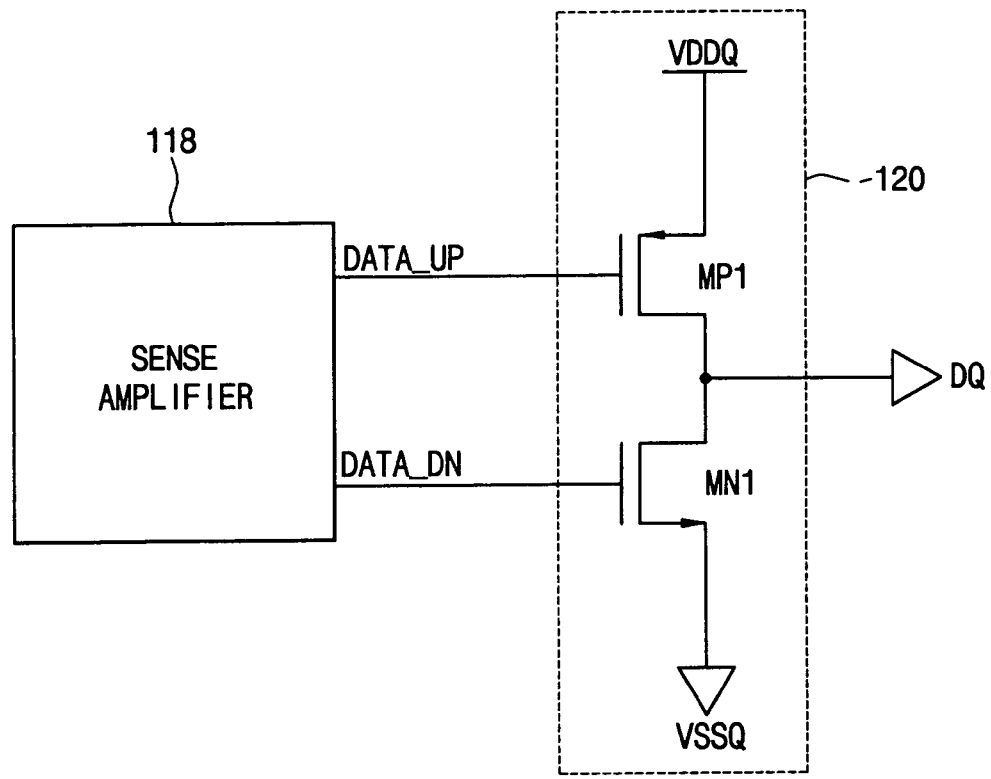
FIG. 3 shows an I/O buffer coupled between voltage nodes VDDQ and VSSQ for charging/discharging an output DQ, according to the prior art.
Figure 4:
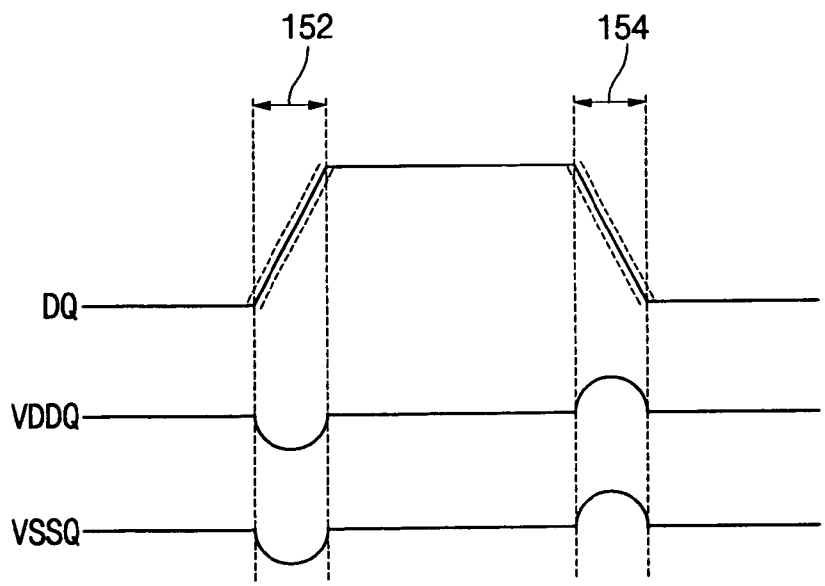
FIG. 4 shows a timing diagram during operation of the I/O buffer of FIG. 3, according to the prior art.
Figure 5:
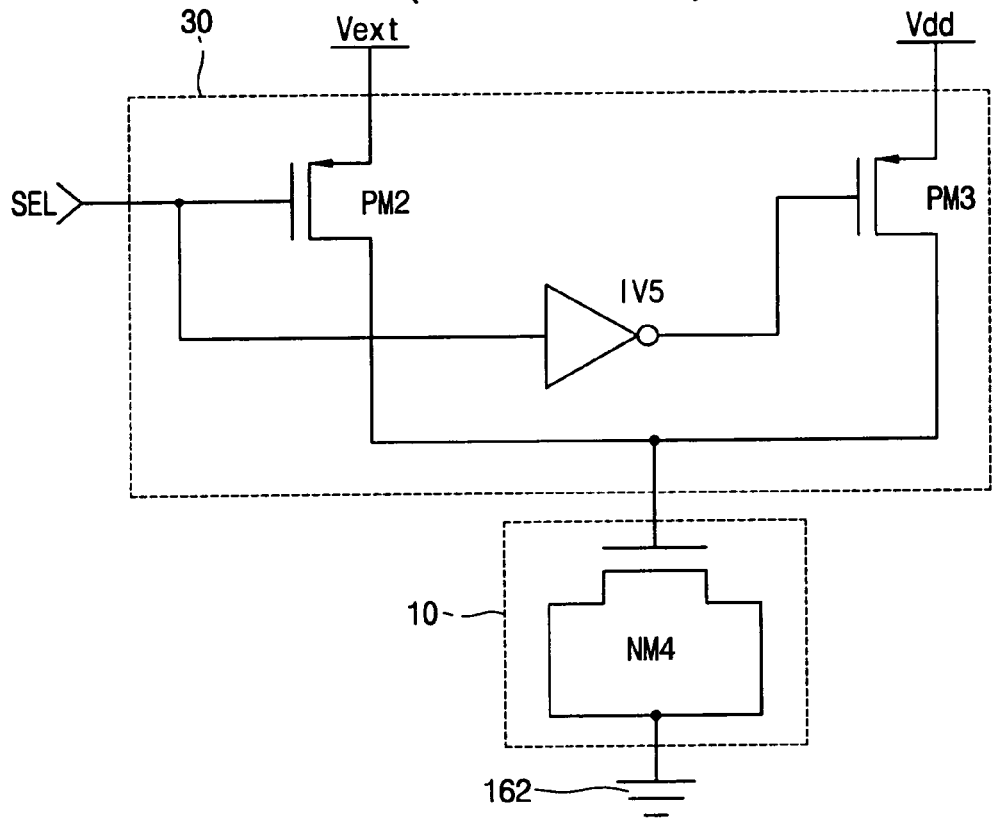
FIG. 5 shows a capacitor control section that controls coupling of a control capacitor between two different voltage sources with respect to a same ground node, according to the prior art.
Figure 6:
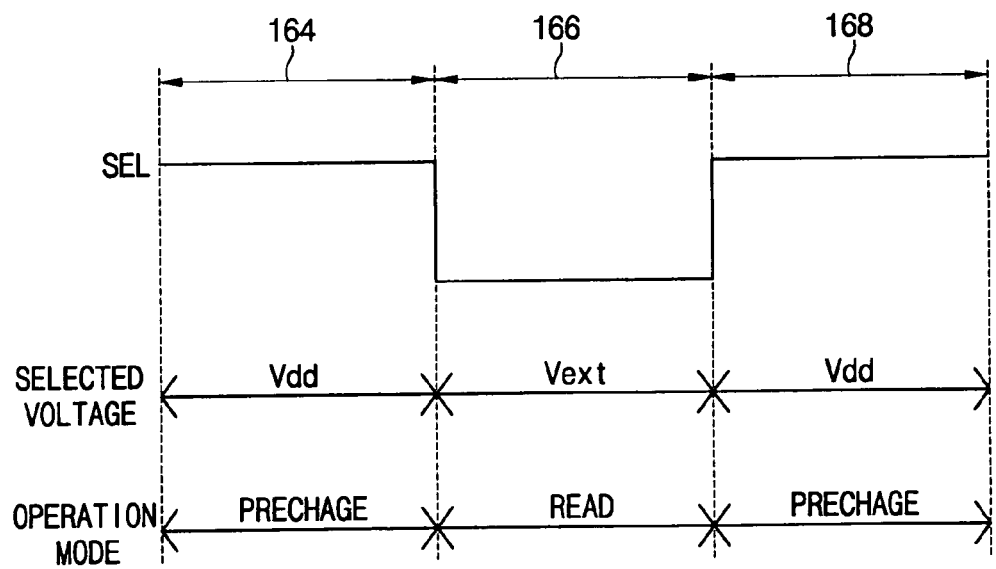
FIG. 6 shows a timing diagram during operation of the control section of FIG. 5, according to the prior art.

The voltage sources VDD/VSS and VDDQ/VSSQ are used by a semiconductor device such as the memory device 102 of FIG. 1 for example. In that case, the components of the apparatus 200 of FIG. 7 are fabricated as part of an integrated circuit of the semiconductor device in one embodiment of the present invention. Referring to FIGS. 1 and 7, VDD/VSS is typically used for the peripheral circuit providing data paths from the core array of memory cells 104. VDDQ/VSSQ is typically used within the I/O buffer 120 for charging/discharging of the output(s) DQ.

Figure 8:
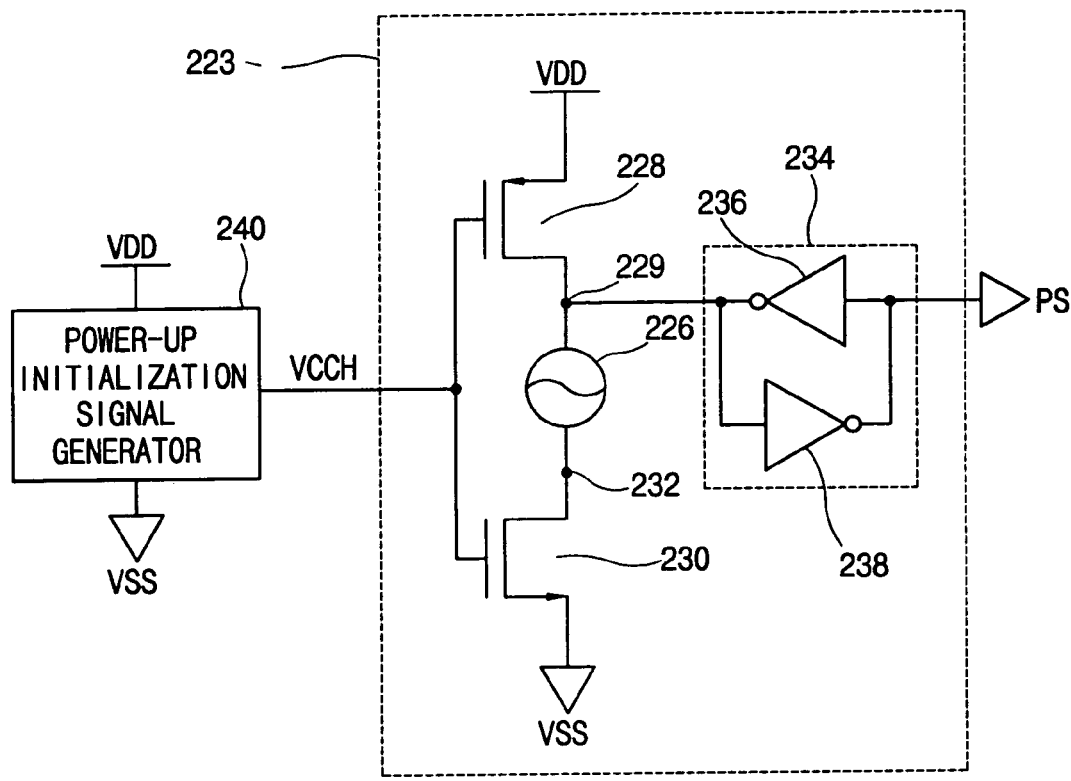
FIG. 8 shows a diagram of a fuse circuit for controlling the switching network of FIG. 7, according to an embodiment of the present invention.

The control signals PS and /PS are generated to couple the shared capacitor 202 to a selected one of the voltage sources VDD/VSS or VDDQ/VSSQ. FIG. 8 shows an example control signal generator 222 that includes a fuse circuit 223 using a fuse 226. The fuse circuit 223 includes a PMOSFET 228 coupled between a high node VDD and a first node 229 of the fuse 226. An NMOSFET 230 is coupled between a low node VSS and a second node 232 of the fuse 226.

The fuse circuit 223 also includes a latch 234 of a loop of inverters 236 and 238 coupled to the first node 229 of the fuse 226. The output of the latch 234 generates the control signal PS. An initialization signal generator 240 generates a voltage VCCH that is a logical high state after power-up. The fuse circuit 223 and the initialization signal generator 240 form the control signal generator 222.

During operation of the fuse circuit 223, when the fuse 226 is cut to be open-circuited, the PS signal is a low logical state. Alternatively, when the fuse 226 is not cut, the PS signal is a high logical state. The fuse 226 is cut or left not cut for setting the logical state of the PS signal during a wafer stage for manufacture of the integrated circuit having the apparatus 200, as will be described further herein.

When the PS signal is the low logical state, the first voltage source VDD/VSS is selected to be coupled to the shared capacitor 202. When the PS signal is the high logical state, the second voltage source VDDQ/VSSQ is selected to be coupled to the shared capacitor 202.

Figure 9:
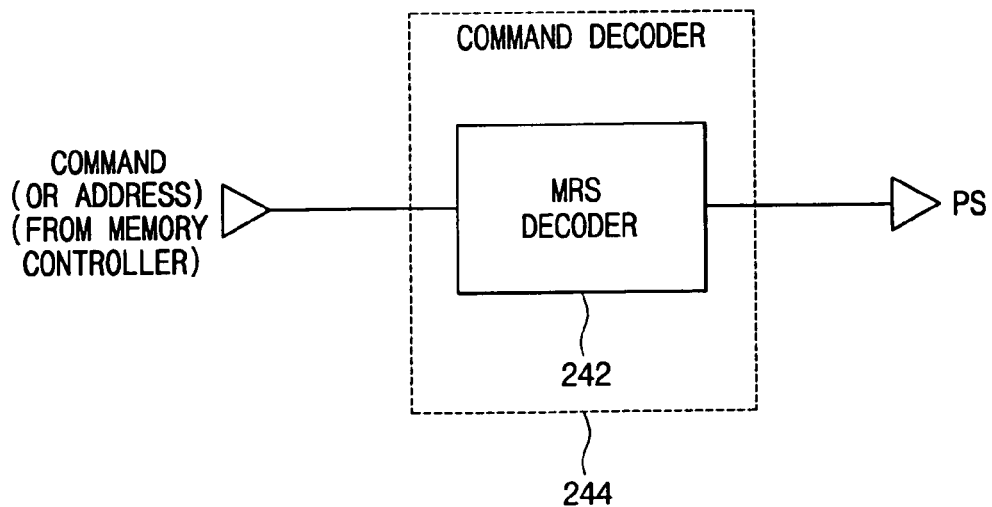
FIG. 9 shows a MRS (mode register set) decoder within a command decoder of a memory device for controlling the switching network of FIG. 7 according to an embodiment of the present invention.

FIG. 9 illustrates a MRS (mode register set) decoder 242 that generates the PS signal from the command signal entered into a command decoder 244 of a memory device. In that case, the MRS decoder 242 acts as the control signal generator 222. Referring to FIGS. 1 and 9, the command decoder 244 is similar to the command decoder 124 of FIG. 1.

The command signal (or an address signal) is provided from a memory controller of the memory device for setting the logical state of the PS signal from the MRS decoder 242. A MRS decoder in general for a DRAM (dynamic random access memory) is individually known to one of ordinary skill in the art. The memory controller for the DRAM is programmed for setting the logical state of the PS signal during a wafer stage or a package stage for manufacture of the DRAM having the apparatus 200, as will be described further herein.

Figure 10:
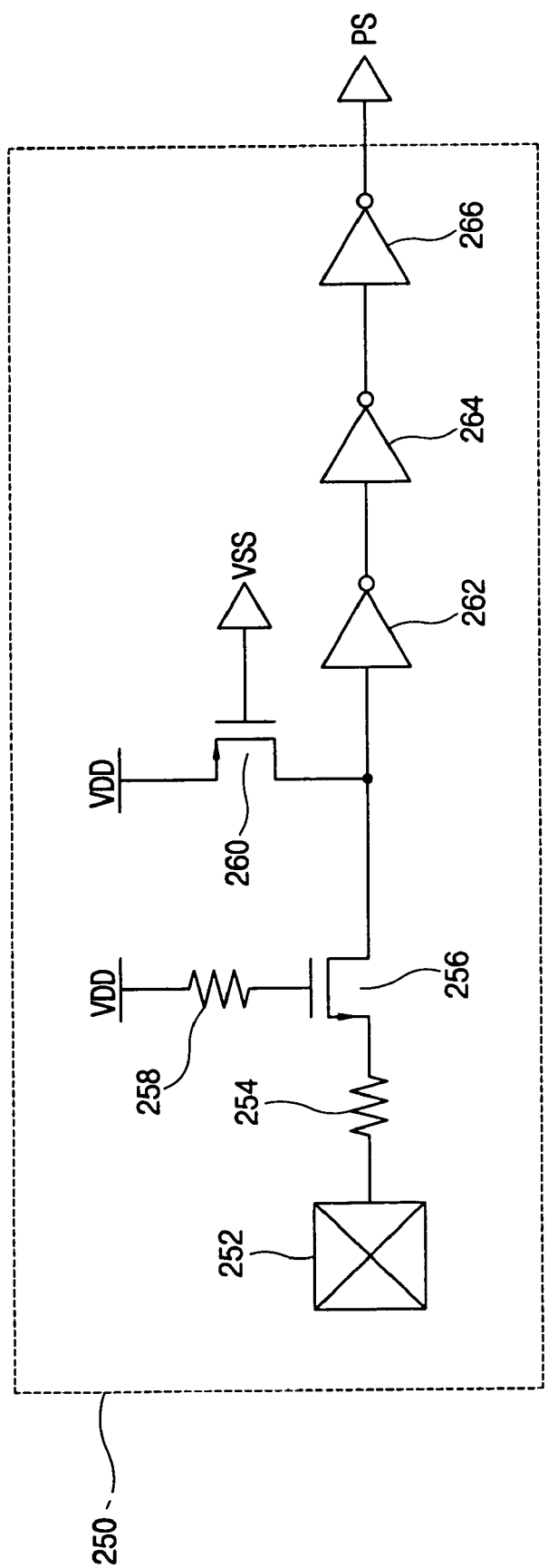
FIG. 10 shows a diagram of a bonding pad circuit for controlling the switching network of FIG. 7, according to an embodiment of the present invention.

FIG. 10 shows a bonding pad circuit 250 using a bonding pad 252 for generating the PS signal. The bonding pad circuit 250 includes a first resistor 254 coupled between the bonding pad 252 and an NMOSFET 256 having a gate coupled to VDD via a second resistor 258. The drains of the NMOSFET 256 and a PMOSFET 260 are coupled together to a chain of inverters 262, 264, and 266. The PMOSFET 260 has a source coupled to VDD, and has a gate coupled to VSS. The output of the inverter 266 generates the PS signal.

If the bonding pad 252 is applied with VDD or is floating, the PS signal is set to the logical low state. Alternatively, if the bonding pad 252 is applied with VSS, the PS signal is set to the logical high state.

The bonding pad 252 and the bonding pad circuit 250 form the control signal generator 222. The bias on the bonding pad 252 is set for determining the logical state of the PS signal during a wafer stage for manufacture of the integrated circuit having the apparatus 200, as will be described further herein.

Figure 11:
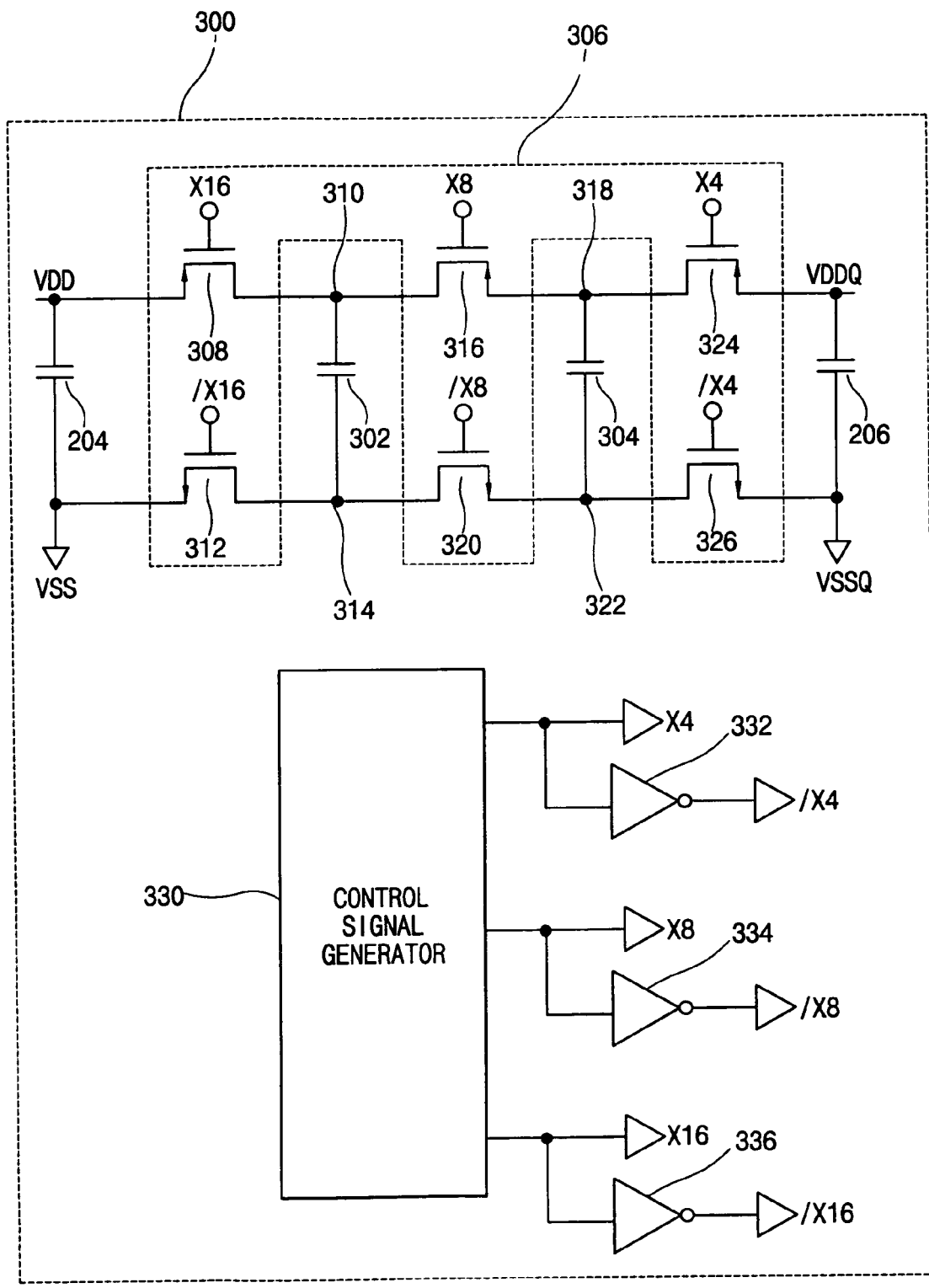
FIG. 11 shows a circuit diagram of a switching network for coupling a variable number of shared capacitors to a data charge voltage source depending on a bit organization of the semiconductor device, according to an embodiment of the present invention.

FIG. 11 illustrates another apparatus 300 for coupling a variable number of shared capacitors to a data charge voltage source (i.e., VDDQ/VSSQ) depending on a bit organization of the semiconductor device, according to another embodiment of the present invention. Elements having the same reference number in FIGS. 7 and 11 refer to elements having similar structure and function.

The apparatus 300 of FIG. 11 includes a first shared capacitor 302 and a second shared capacitor 304. A switching network 306 includes a first PMOSFET 308 coupled between the first high node VDD and a first node 310 of the first shared capacitor 302. A first NMOSFET 312 is coupled between the first low node VSS and a second node 314 of the first shared capacitor 302.

A second PMOSFET 316 is coupled between the first node 310 of the first shared capacitor 302 and a first node 318 of the second shared capacitor 304. A second NMOSFET 320 is coupled between the second node 314 of the first shared capacitor 302 and a second node 322 of the second shared capacitor 304.

A third PMOSFET 324 is coupled between the second high node VDDQ and the first node 318 of the second shared capacitor 304. A third NMOSFET 326 is coupled between the second low node VSSQ and the second node 322 of the second shared capacitor 304.

The gate of the first PMOSFET 308 is coupled to a first control signal X16, and the gate of the first NMOSFET 312 is coupled to a complement of the first control signal /X16. The gate of the second PMOSFET 316 is coupled to a second control signal X8, and the gate of the second NMOSFET 320 is coupled to a complement of the second control signal /X8. The gate of the third PMOSFET 324 is coupled to a third control signal X4, and the gate of the third NMOSFET 326 is coupled to a complement of the third control signal /X4.

Figure 12:
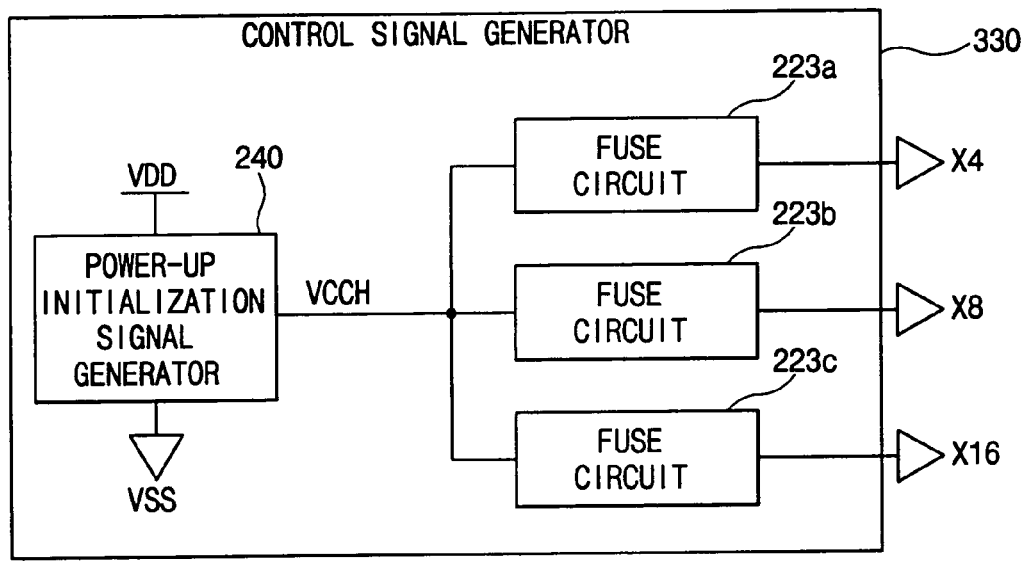
FIG. 12 shows a block diagram of an example control signal generator using fuses for controlling the switching network of FIG. 11, according to an embodiment of the present invention.

The apparatus 300 of FIG. 11 includes a control signal generator 330 and inverters 332, 334, and 336 for generating the control signals X4, /X4, X8, /X8, X16, and /X16. FIG. 12 illustrates an example implementation of the control signal generator 330 including the initialization signal generator 240 for generating the VCCH signal that is a logical high state after power-up, similar to FIG. 8.

The control signal generator 330 of FIG. 12 also includes a respective fuse circuit 223A, 223B, and 223C for each of the control signals X4, X8, and X16. Each of the fuse circuits 223A, 223B, and 223C has a respective fuse therein that is cut or left not cut for setting the respective logical state of each of the signals X4, X8, and X16, similar to the fuse circuit 223 of FIG. 8. The respective fuse for each of the fuse circuits 223A, 223B, and 223C is cut or left not cut during a wafer stage for manufacture of the integrated circuit having the apparatus 300, as will be described further herein.

Figure 13:
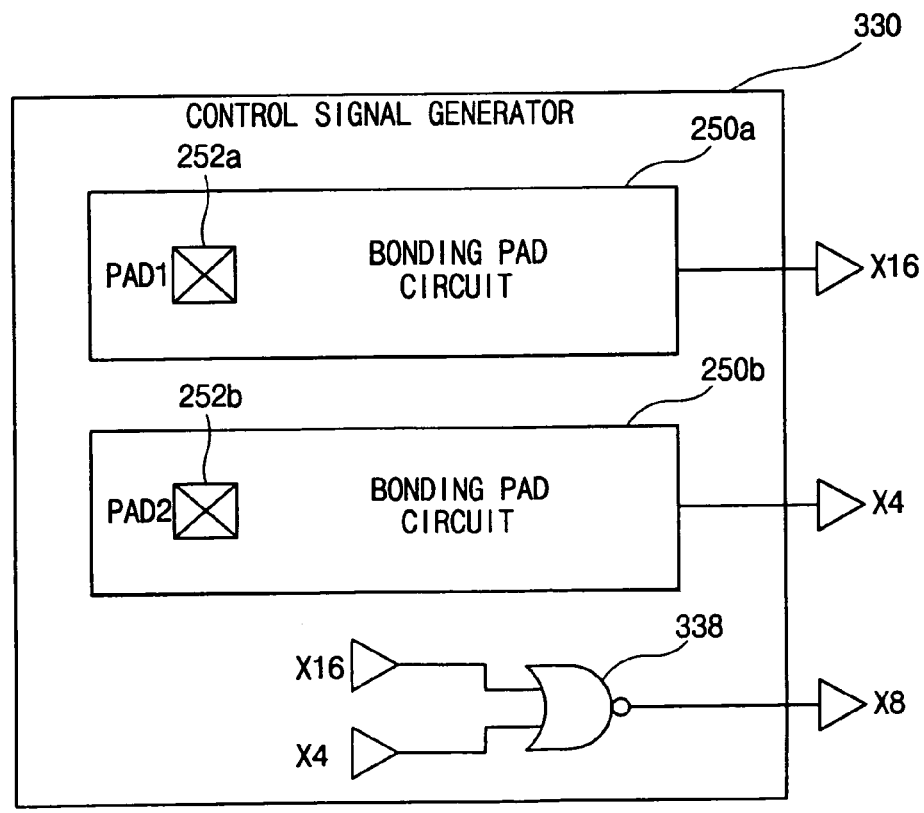
FIG. 13 shows a block diagram of an example control signal generator using bonding pads for controlling the switching network of FIG. 11, according to an embodiment of the present invention.

FIG. 13 shows another example implementation of the control signal generator 330 including bonding pad circuits 250A and 250B, each similar to the bonding pad circuit 250 of FIG. 10. A first bonding pad circuit 250A includes a first bonding pad 252A, and a second bonding pad circuit 250B includes a second bonding pad 252B.

The respective bias on each of the bonding pads 252A and 252B determines the respective logical state of each of the control signals X16 and X4 that are input to a NOR gate 338 that outputs the control signal X8. The biases on the bonding pads 252A and 252B are set for determining the logical states of the X4, X8, and X16 signals during a wafer stage for manufacture of the integrated circuit having the apparatus 300, as will be described further herein.

The apparatus 300 is part of a semiconductor device having a bit organization which indicates a number of output pins that are simultaneously charged/discharged. For example, assume that the bit-organization is for simultaneously charging/discharging sixteen output pins for output signals DQ. In that case, both of the shared capacitors 302 and 304 are desired to be coupled to the second voltage source VDDQ/VSSQ. Thus, the control signals X4 and X8 are set to the logical low state while the control signal X16 is set to the logical high state.

Alternatively, assume that the bit-organization is for simultaneously charging/discharging eight output pins for output signals DQ. In that case, just the second shared capacitor 304 is desired to be coupled to the second voltage source VDDQ/VSSQ. Thus, the control signals X4 and X16 are set to the logical low state while the control signal X8 is set to the logical high state.

Additionally, assume that the bit-organization is for simultaneously charging/discharging four output pins for output signals DQ. In that case, none of the shared capacitors 302 and 304 is desired to be coupled to the second voltage source VDDQ/VSSQ. Thus, the control signal X4 is set to the logical high state while the control signals X8 and X16 are set to the logical low state.

In this manner, the switching network 306 of FIG. 11 couples a variable number of the shared capacitors 302 and 304 to the data charge voltage source (i.e., VDDQ/VSSQ) depending on the bit organization of the semiconductor device having the apparatus 300. A higher number of the shared capacitors 302 and 304 is coupled to VDDQ/VSSQ for charging/discharging a higher number of output pins of the output signals DQ.

Figure 14:
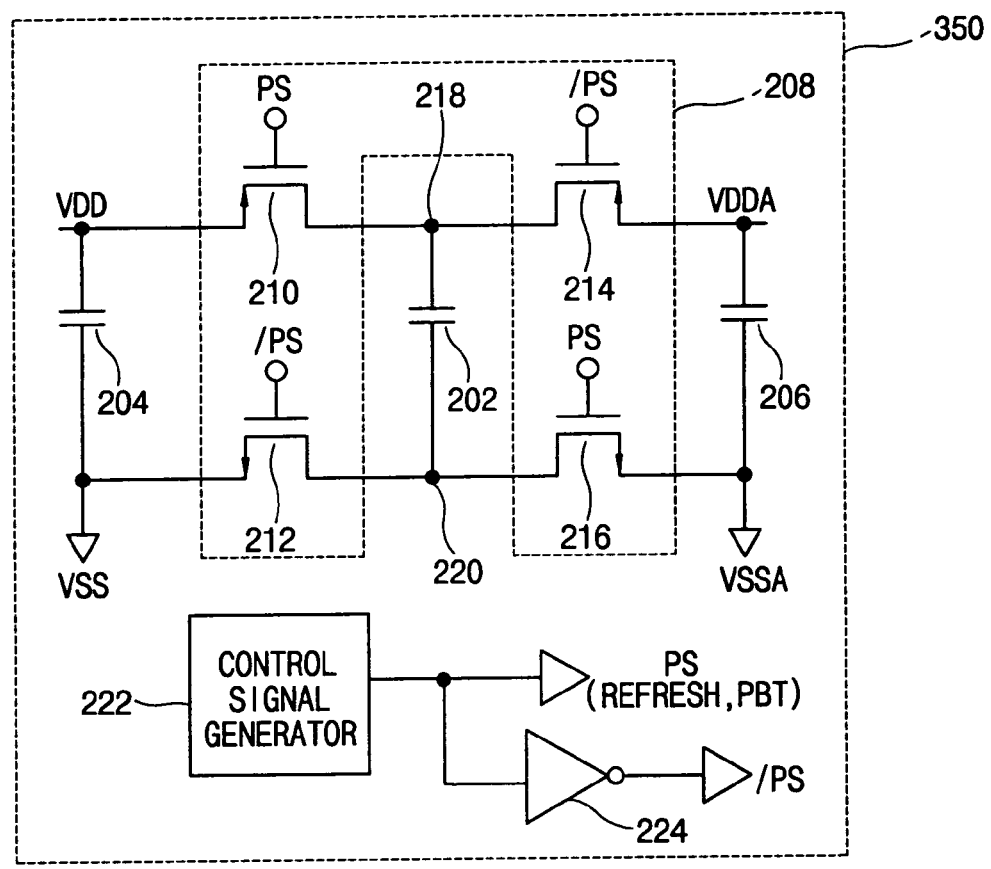
FIG. 14 shows the circuit diagram of FIG. 7 with the switching network coupled between VDD/VSS and VDDA/VSSA, for an embodiment of the present invention.

FIG. 14 shows an alternative apparatus 350 with the switching network 208 coupled between the first voltage source VDD/VSS and a second voltage source VDDA/VSSA. Elements having the same reference number in FIGS. 7 and 14 refer to elements having similar structure and function.

Figure 15A:
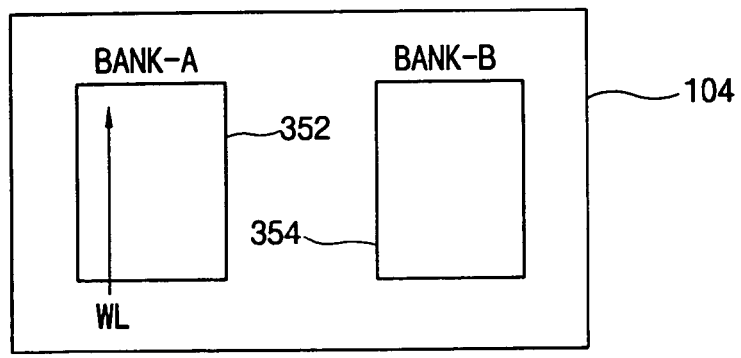
FIGS. 15A, 15B, and 15C illustrate different word lines that are activated for a typical read/write operation, a refresh operation, and a parallel bit test operation of a memory device.
Figure 15B:
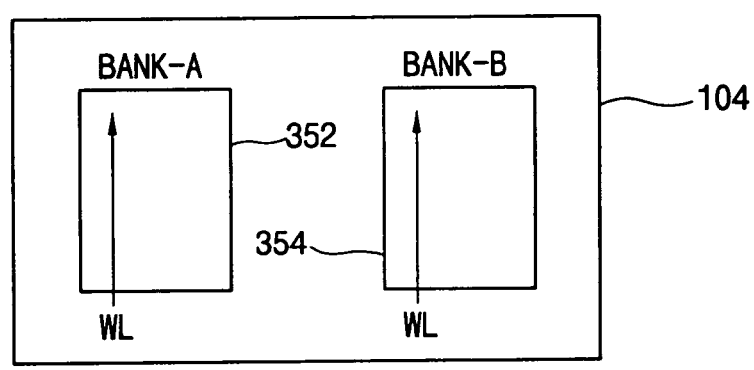
Figure 15C:
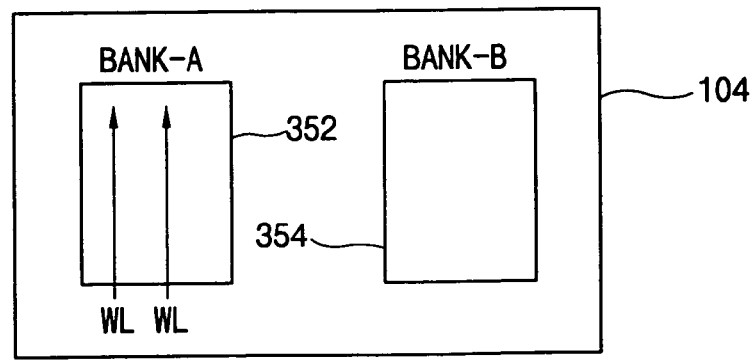

FIG. 15A shows the array of memory cells 104 divided into a plurality of memory banks 352 and 354. FIG. 15A illustrates one word line activated for a typical read/write operation. On the other hand, FIG. 15B shows a plurality of word lines in both of the memory banks 352 and 354 activated for a refresh operation. Alternatively, FIG. 15C shows a plurality of word-lines in one of the memory banks 352 and 354 activated for a PBT (parallel bit test) operation. Such operations with activation of such word line(s) in FIGS. 15A, 15B, and 15C are individually known to one of ordinary skill in the art.

The second voltage source VDDA/VSSA is an external memory cell array voltage source used by the array of memory cells 104 for the refresh and PBT operations of FIGS. 15B and 15C. Referring to FIG. 14, the PS signal is set to a logical high state if a refresh or PBT operation is to be performed on the array of memory cells 104 to couple the shared capacitor 202 to the second voltage source VDDA/VSSA. The increased decoupling capacitance from the shared capacitor 202 enhances stability during the refresh or PBT operations as multiple word-lines are coupled to the second voltage source VDDA/VSSA.

Figure 16:
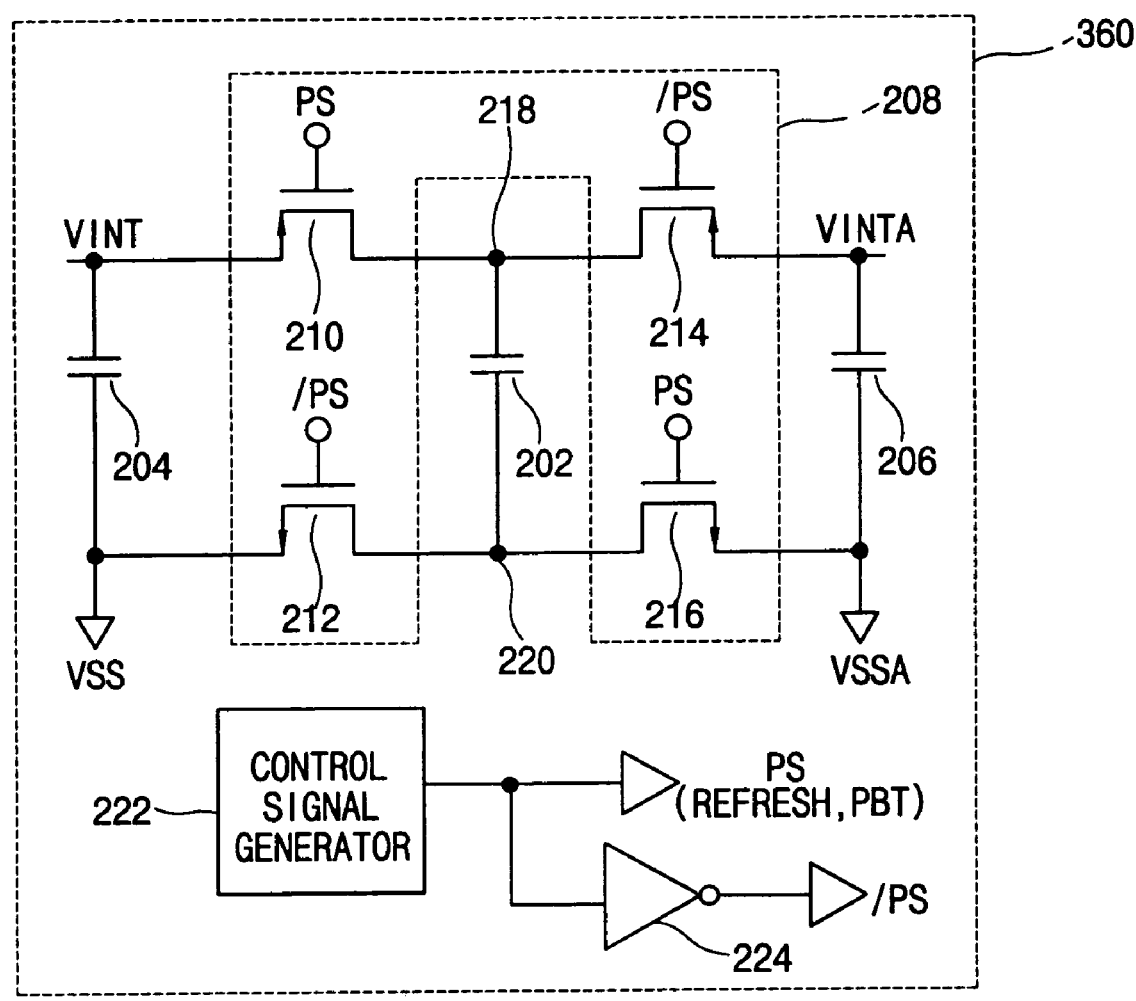
FIG. 16 shows the circuit diagram of FIG. 7 with the switching network coupled between VINT/VSS and VINTA/VSS, for an embodiment of the present invention.

FIG. 16 shows an alternative apparatus 360 with the switching network 208 coupled between a first voltage source VINT/VSS and a second voltage source VINTA/VSSA. Elements having the same reference number in FIGS. 14 and 16 refer to elements having similar structure and function.

In FIG. 16, the second voltage source VINTA/VSSA is an internal memory cell array voltage source used by the array of memory cells 104 for the refresh and PBT operations of FIGS. 15B and 15C. Thus, the PS signal is set to a logical high state if a refresh or PBT operation is to be performed on the array of memory cells 104 to couple the shared capacitor 202 to the second voltage source VINTA/VSSA. The first voltage source VINT/VSS is used by the peripheral circuit outside of the array of memory cells 104.

Figure 17:
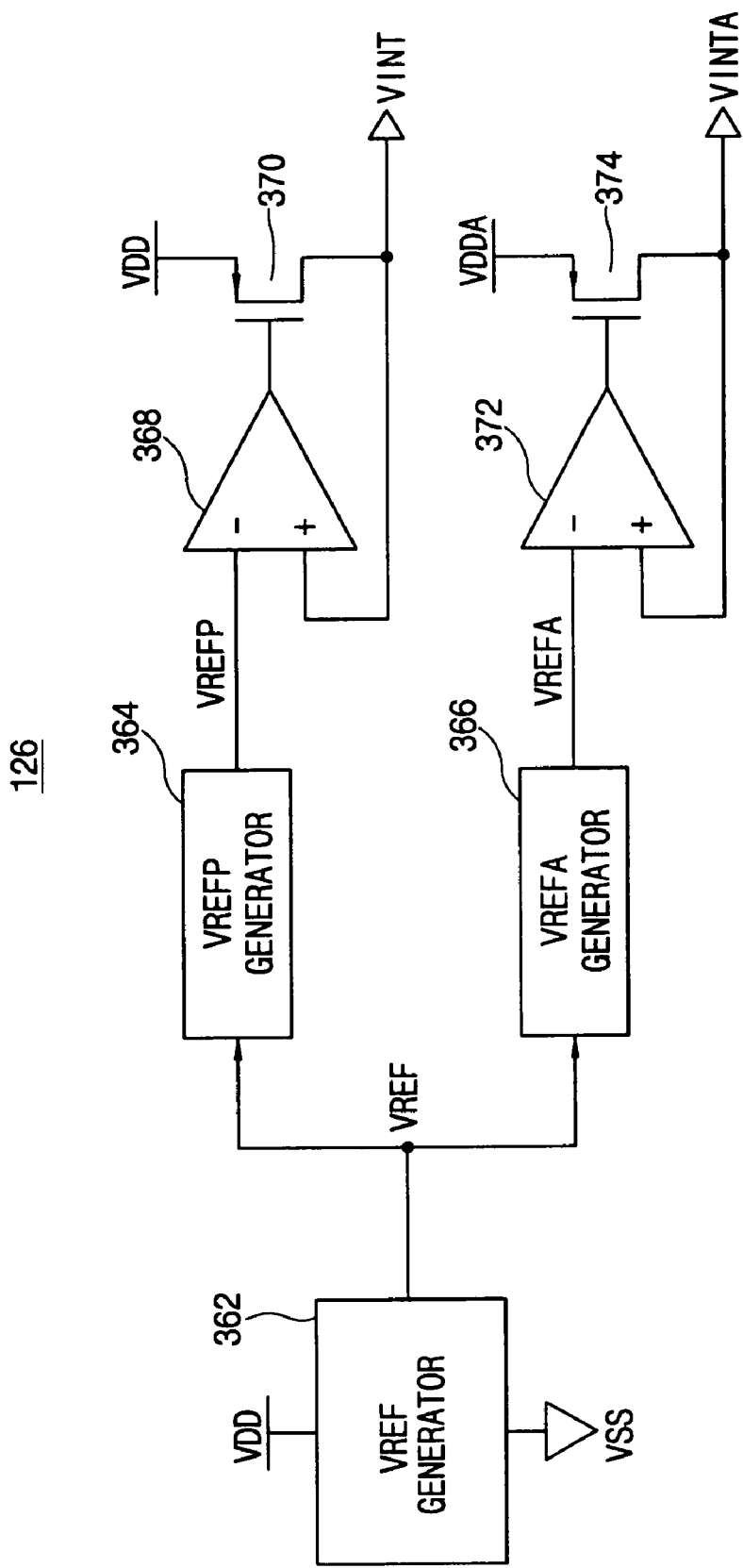
FIG. 17 shows an example voltage generator for generating VINT/VSS and VINTA/VSS of FIG. 16.

Both the first and second voltages VINT/VSS and VINTA/VSSA are internally generated by the voltage generator 126 such as in FIG. 17 for example. Referring to FIG. 17, a VREF generator 362 generates a main reference voltage VREF for a VREFP generator 364 and a VREFA generator 366. The VREFP generator 364 generates a peripheral reference voltage VREFP from VREF, and the VREFA generator 366 generates an array reference voltage VERFA from VREF.

Further referring to FIG. 17, a first operational amplifier 368 and a first PMOSFET 370 generate the VINT that is substantially equal to VREFP. Similarly, a second operational amplifier 372 and a second PMOSFET 374 generate the VINTA that is substantially equal to VREFA. Such components of FIG. 17 for generating VINT and VINTA are individually known to one of ordinary skill in the art.

Figure 18:
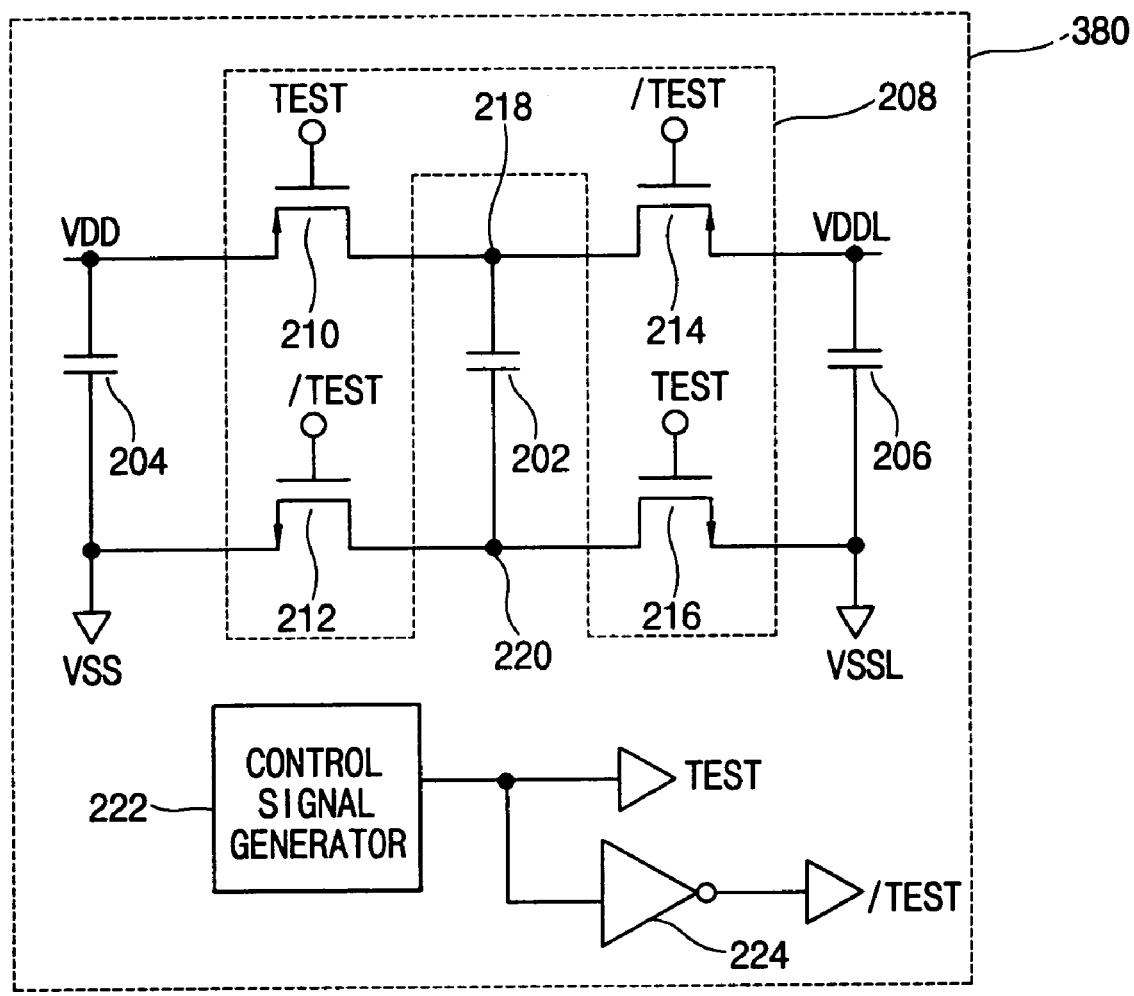
FIG. 18 shows the circuit diagram of FIG. 7 with the switching network coupled between VDD/VSS and VDDL/VSSL, for an embodiment of the present invention.

FIG. 18 shows an alternative apparatus 380 with the switching network 208 coupled between the first voltage source VDD/VSS and a second voltage source VDDL/VSSL. Elements having the same reference number in FIGS. 7 and 18 refer to elements having similar structure and function.

The second voltage source VDDL/VSSL is a delay (or phase) locked loop voltage source used by the DLL (or PLL) 122 for generating a synchronized clock signal CLKDQ from an external clock signal CLK. Referring to FIGS. 1 and 18, the switching network 208 couples the shared capacitor 202 to the second voltage source VDDL/VSSL if such a synchronized clock signal CLKDQ is to be used by the semiconductor device.

Figure 19A:
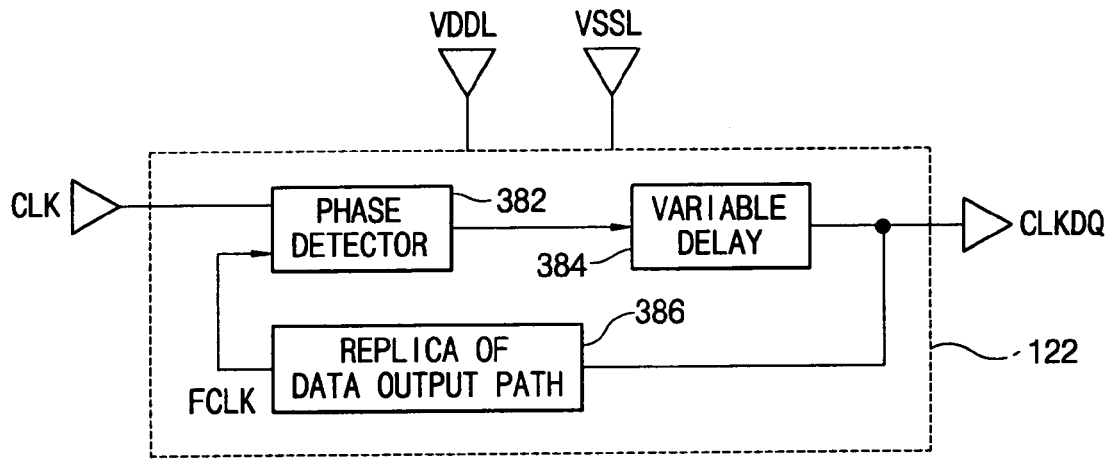
FIGS. 19A and 19B show block diagrams of an example delay locked loop and an example phase locked loop that each uses the voltage source VDDL/VSSL of FIG. 18.

FIG. 19A illustrates an example DLL (delay locked loop) 122 including a phase detector 382, a variable delay unit 384, and replica of a data output path 386 for the output signals DQ. The DLL 122 and such components of the DLL 122 for generating the synchronized clock signal CLKDQ in FIG. 19A are individually known to one of ordinary skill in the art.

Figure 19B:
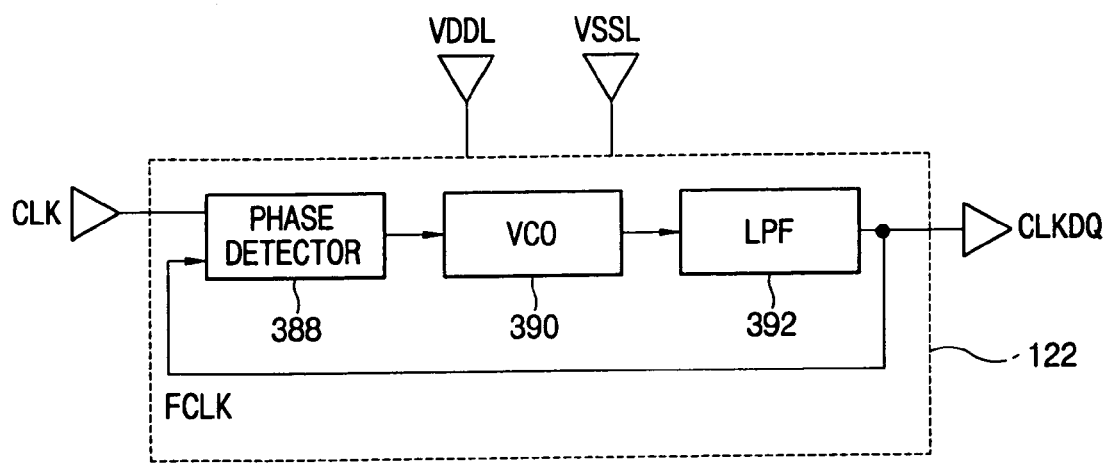

FIG. 19B illustrates an example PLL (phase locked loop) 122 including a phase detector 388, a VCO (voltage controller oscillator) 390, and a LPF (low pass filter) 392. The PLL 122 and such components of the PLL 122 for generating the synchronized clock signal CLKDQ in FIG. 19B are individually known to one of ordinary skill in the art.

The components of the DLL 122 of FIG. 19A or of the PLL 122 of FIG. 19B derive power from the voltage source VDDL/VSSL. When a total decoupling capacitance across the high and low nodes VDDL and VSSL is increased, jitter of the synchronized clock signal CLKDQ is advantageously decreased. In FIG. 18, the PS signal is set to a logical high state if the semiconductor device is to use the synchronized clock signal CLKDQ to couple the shared capacitor 202 to the second voltage source VDDL/VSSL.

Figure 20:
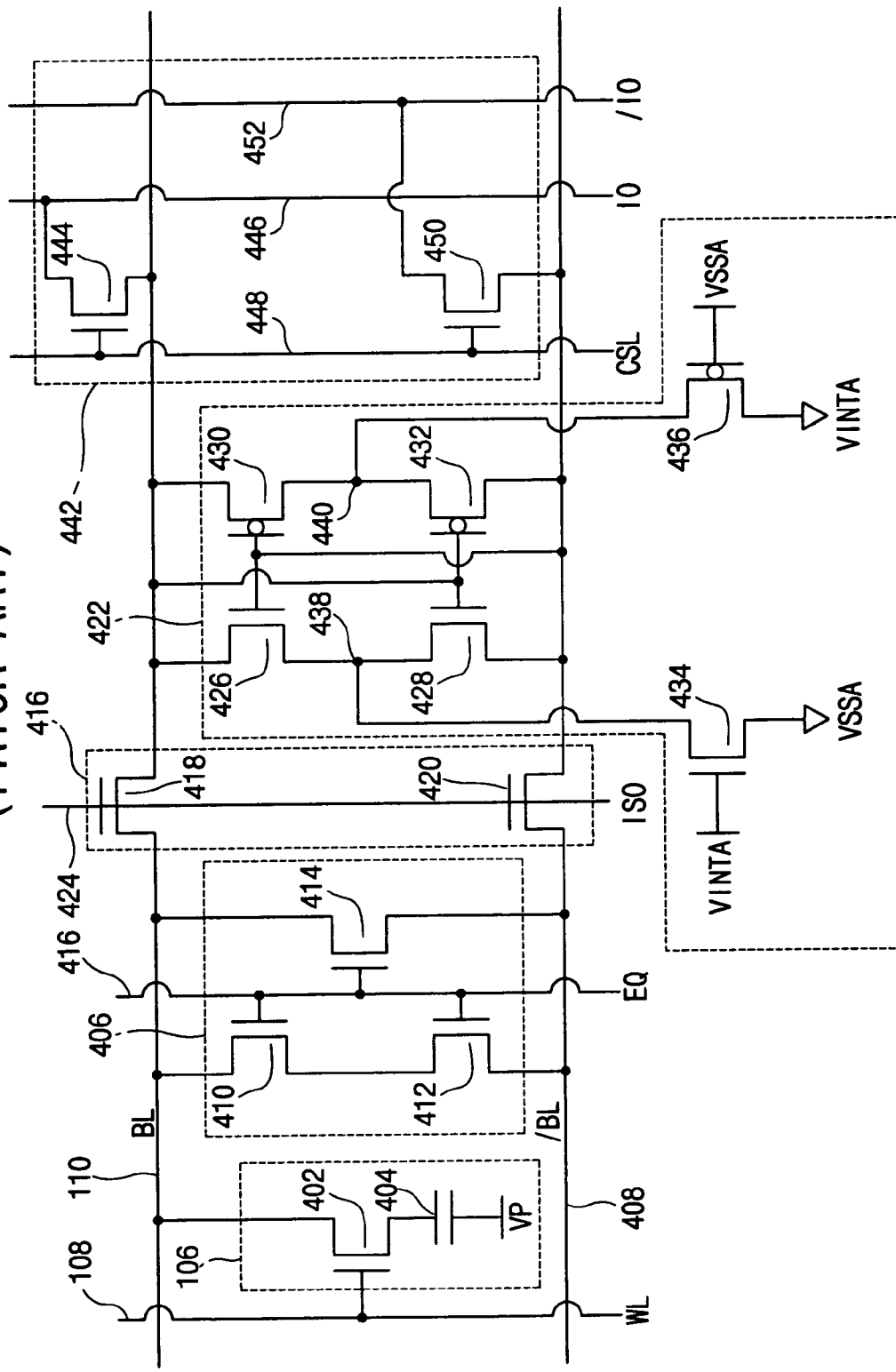
FIG. 20 shows a circuit diagram of a memory cell, an equalization unit, an isolation unit, a sense amplifier, and a column select unit, as known in the prior art.

FIG. 20 shows the memory cell 106 of FIG. 1 coupled to the word line 108 and the bit line 110. The memory cell 106 is comprised of a cell access transistor 402 and a charge storage capacitor 404 coupled between the transistor 402 and a voltage source VP. Such a memory cell 106 is typical for a DRAM (dynamic random access memory) as known to one of ordinary skill in the art.

Referring to FIG. 20, an equalization unit 406 is coupled between the bit line 110 and a complementary bit line 408. The equalization unit 406 includes first and second NMOSFETs 410 and 412 coupled in series between the bit line 110 and the complementary bit line 408. The equalization unit 406 also includes a third NMOSFET 414 coupled between the bit line 110 and the complementary bit line 408. The gates of the NMOSFETs 410, 412, and 414 are coupled to an equalization line 416. The equalization unit 406 is used to equalize the voltage on the bit line 110 and the complementary bit line 408 during a pre-charge operation.

Further referring to FIG. 20, an isolation unit 416 includes a fourth NMOSFET 418 and a fifth NMOSFET 420 coupled in series through the bit line 110 and the complementary bit line 408, respectively, before a sense amplifier 422. The gates of the fourth and fifth NMOSFETs 418 and 420 are coupled to an isolation line 424. The isolation unit 416 couples the memory cell 106 to the sense amplifier 422 if the memory cell 106 is to be accessed. The sense amplifier 422 may be shared by the memory cell 106 and another memory cell. If another memory cell is to be accessed, the isolation unit electrically isolates the memory cell 106 from the sense amplifier 422.

The sense amplifier 422 includes a sixth NMOSFET 426 and a seventh NMOSFET 428 coupled in series between the bit line 110 and the complementary bit line 408. The sense amplifier 422 also includes a first PMOSFET 430 and a second PMOSFET 432 coupled in series between the bit line 110 and the complementary bit line 408.

The gates of the sixth NMOSFET 426 and the first PMOSFET 430 are coupled together to the complementary bit line 408, and the gates of the seventh NMOSFET 428 and the second PMOSFET 432 are coupled together to the bit line 110. The sense amplifier 422 further includes an eighth NMOSFET 434 and a third PMOSFET 436 for biasing middle nodes 438 and 440, respectively. The sense amplifier 422 amplifies the data signal from the memory cell 106 as known to one of ordinary skill in the art.

Further referring to FIG. 20, a column select unit 442 is coupled to the bit line 110 and the complementary bit line 408. The column select unit 442 includes a ninth NMOSFET 444 having a drain, a gate, and a source coupled to an I/O (input/output) line 446, a column select line 448, and the bit line 110, respectively.

The column select unit 442 also includes a tenth NMOSFET 450 having a drain, a gate, and a source coupled to a complementary I/O line 452, the column select line 448, and the complementary bit line 408, respectively. The column select unit 442 couples the bit line 110 and the complementary bit line 408 to the I/O line 446 and the complementary I/O line 452, respectively, when the memory cell 106 is to be accessed.

Such components 406, 416, 422, and 442 associated with the memory cell 106 are individually known to one of ordinary skill in the art.

Figure 21:
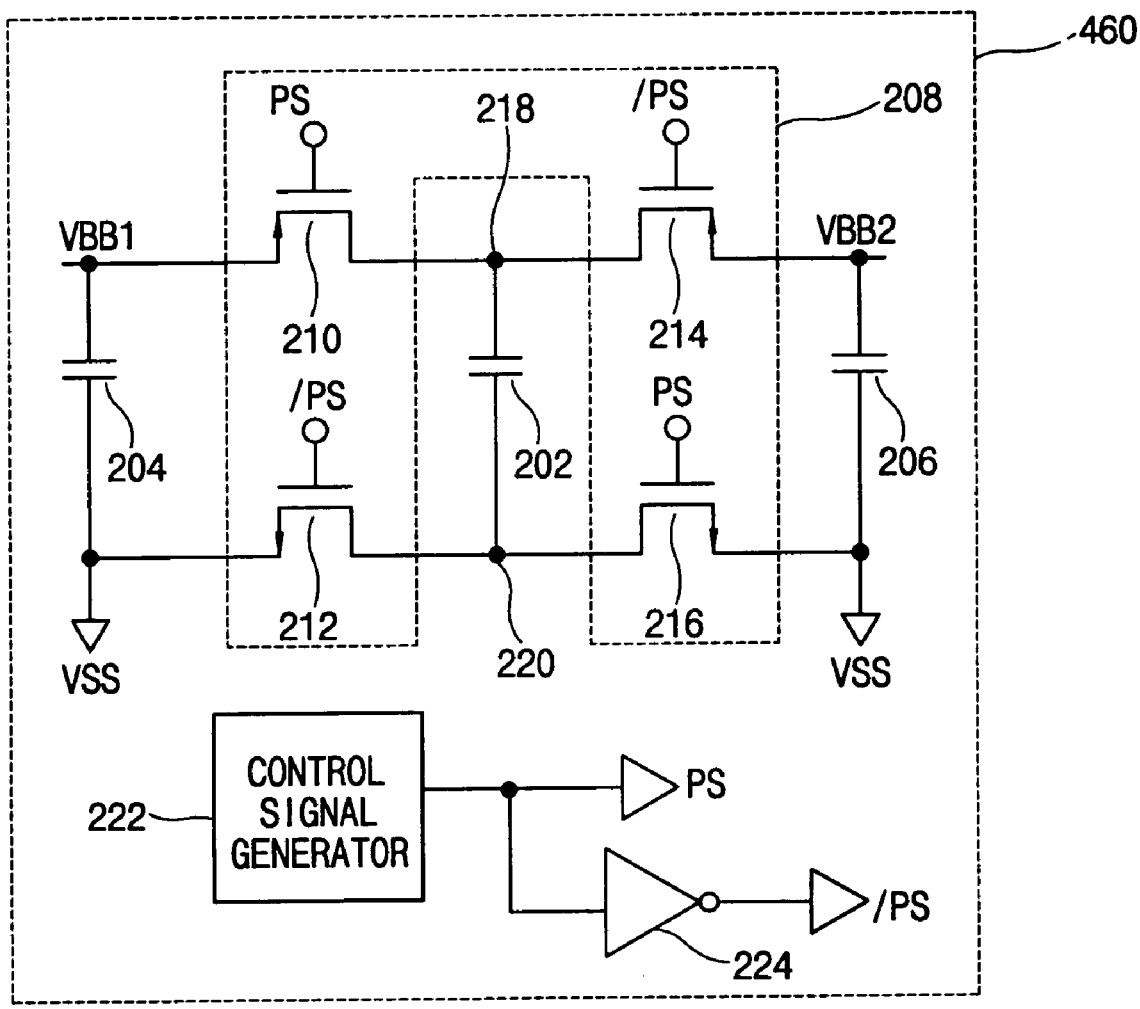
FIG. 21 shows the circuit diagram of FIG. 7 with the switching network coupled between VBB1/VSS and VBB2/VSS, for an embodiment of the present invention.

FIG. 21 shows an alternative apparatus 460 with the switching network 208 coupled between a first voltage source VBB1/VSS and a second voltage source VBB2/VSS. Elements having the same reference number in FIGS. 7 and 21 refer to elements having similar structure and function.

Figure 22A:
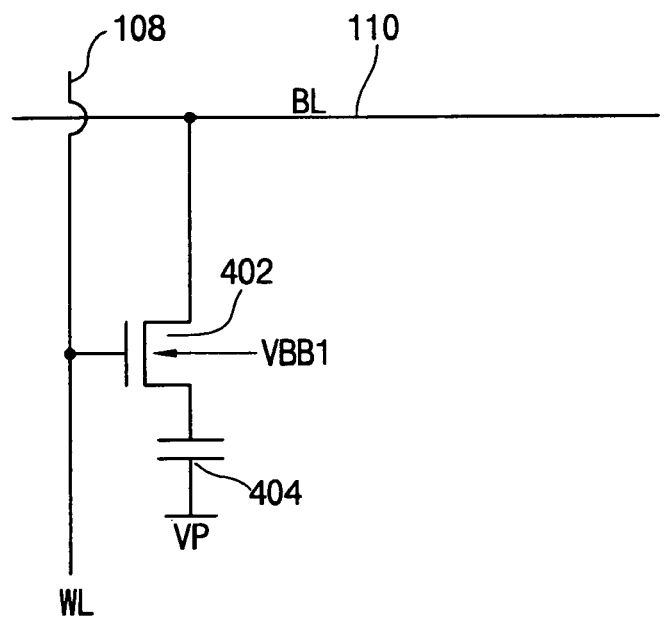
FIG. 22A illustrates use of VBB1/VSS of FIG. 21, and FIG. 22B illustrate use of VBB2/VSS of FIG. 21, for a memory device as known in the prior art.

The voltage across the high and low nodes VBB1 and VSS is about −0.7 Volts, and the voltage across the high and low nodes VBB2 and VSS is about −0.4 Volts. FIG. 22A illustrates the first voltage source VBB1/VSS of FIG. 21 being used for a back bias of the access transistor 402 of FIG. 20.

Figure 22B:
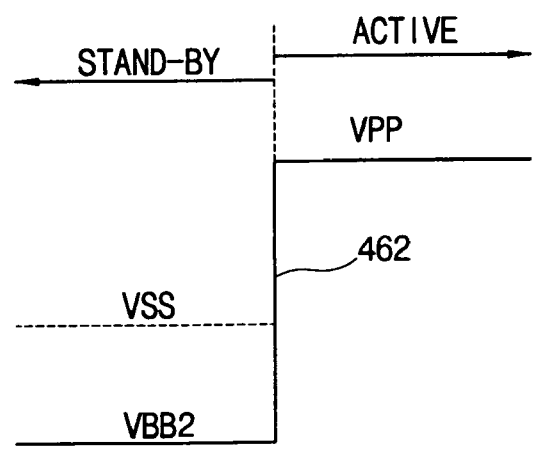

FIG. 22B illustrates the second voltage source VBB2/VSS being used as a negative word line pre-charge voltage during a stand-by mode of the word-line voltage wave-form 462. During the active mode, the word-line has a voltage of VPP applied thereon, but has the voltage of VBB2 applied thereon during the stand-by mode. Such uses of the voltage sources VBB1/VSS and VBB2/VSS individually are known to one of ordinary skill in the art.

During testing of a semiconductor device having the apparatus 460, one determines whether the semiconductor device performs better with the shared capacitor 202 coupled to the first voltage source VBB1/VSS or to the second voltage source VBB2/VSS. The control signal PS is set such that the shared capacitor 202 is coupled to a selected one of the first and second voltage sources VBB1/VSS and VBB2/VSS resulting in better performance of the memory device.

Figure 23:
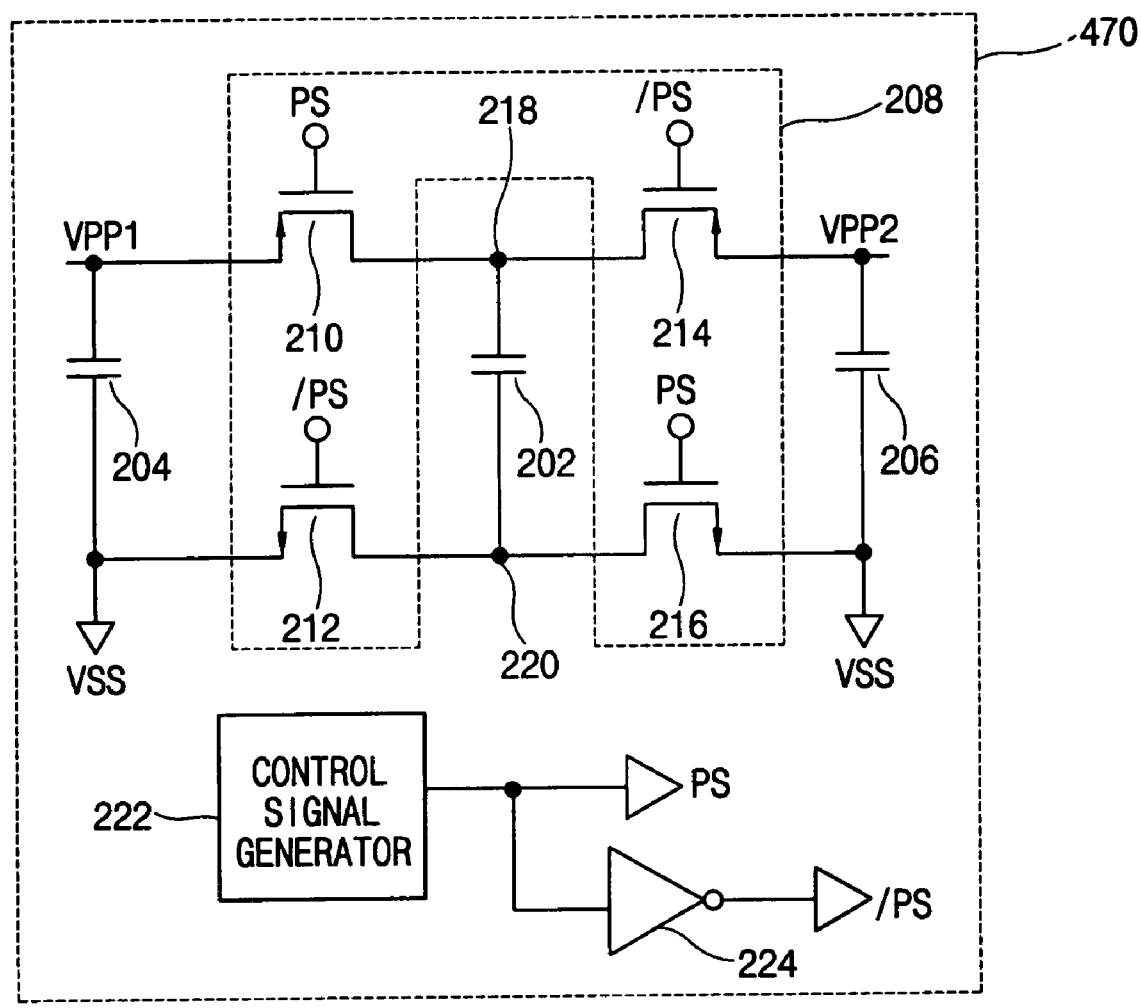
FIG. 23 shows the circuit diagram of FIG. 7 with the switching network coupled between VPP1/VSS and VPP2/VSS, for an embodiment of the present invention.

FIG. 23 shows another apparatus 470 with the switching network 208 coupled between a first voltage source VPP1/VSS and a second voltage source VPP2/VSS. Elements having the same reference number in FIGS. 7 and 23 refer to elements having similar structure and function.

The voltage across the high and low nodes VPP1 and VSS is about 3.5 Volts, and the voltage across the high and low nodes VPP2 and VSS is about 3.2 Volts. Referring to FIG. 20, the first voltage source VPP1/VSS is used as a word line boosting voltage, and the second voltage source VPP2/VSS is used for biasing the isolation line 424 and the equalization line 416 of FIG. 20. Such uses of the voltage sources VPP1/VSS and VPP2/VSS individually are known to one of ordinary skill in the art.

Figure 24:
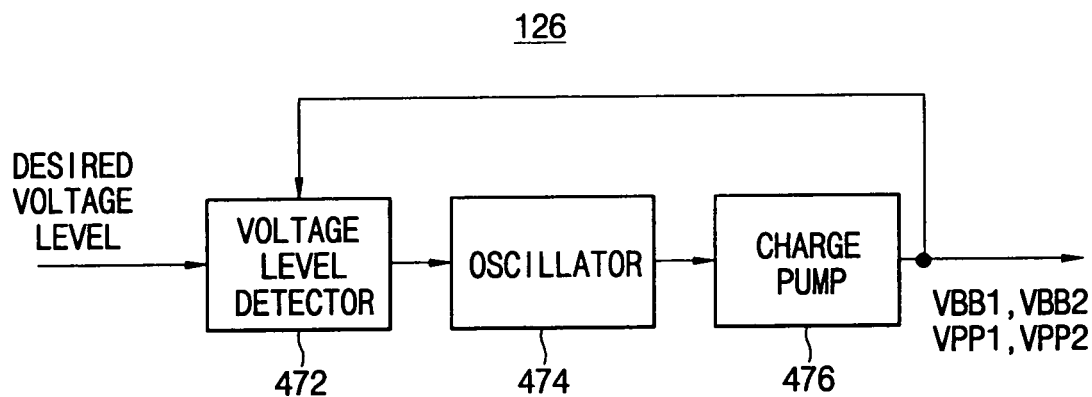
FIG. 24 shows an example voltage generator for generating VBB1/VSS, VBB2/VSS, VPP1/VSS, and VPP2/VSS of FIGS. 21 and 23.

FIG. 24 shows an example implementation of the voltage generator 126 for generating the voltages VBB1, VBB2, VPP1, and VPP2 with respect to the voltage VSS. The voltage generator 126 of FIG. 24 includes a voltage level detector 472, an oscillator 474, and a charge pump 476. A desired voltage level for one of the voltages VBB1, VBB2, VPP1, and VPP2 is indicated to the voltage level detector 472.

The charge pump 476 generates the one of the voltages VBB1, VBB2, VPP1, and VPP2. The output of the charge pump 476 is compared to the desired voltage level by the voltage level detector 472 that controls the oscillator 474 until the output of the charge pump 476 is substantially equal to the desired voltage level. Such components of FIG. 24 for generating VBB1, VBB2, VPP1, and VPP2 are individually known to one of ordinary skill in the art.

During testing of a memory device having the apparatus 460, one determines whether the memory device performs better with the shared capacitor 202 coupled to the first voltage source VBB1/VSS or to the second voltage source VBB2/VSS. The control signal PS is set such that the shared capacitor 202 is coupled to a selected one of the first and second voltage sources VBB1/VSS and VBB2/VSS resulting in better performance of the memory device.

Figure 25:
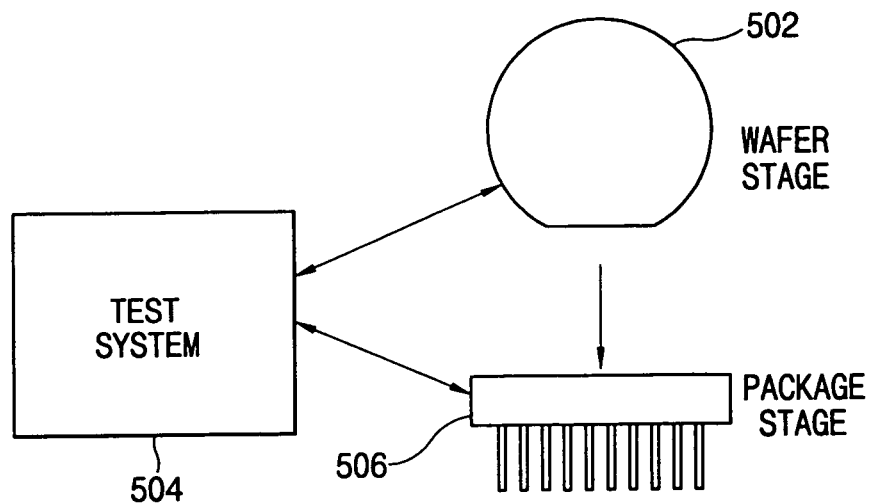
FIG. 25 is a block diagram illustrating how the control signals controlling the switching network are set during a wafer stage or a package stage during manufacture of the semiconductor device, according to an embodiment of the present invention.

For each of the embodiments of FIGS. 7, 11, 14, 16, 18, 21, and 23, characteristics of elements such as a fuse, a bonding pad, or a MRS decoder are set within the control signal generator 222 or 330 for indicating the logical state of the control signal(s) PS or X4, X8, and X16 during a wafer stage or a package stage for manufacture of the semiconductor device, in one embodiment of the present invention. Referring to FIG. 25, the semiconductor device having the apparatus of FIG. 7, 11, 14, 16, 18, 21, or 23 is fabricated as an integrated circuit within a die of a semiconductor wafer 502.

After fabrication of such an integrated circuit, the semiconductor wafer 502 is placed into a test system 504. The test system 504 determines the selected one of the voltage sources for coupling the shared capacitor 202 thereto for best performance of the semiconductor device.

The term "wafer stage" refers to a stage in the manufacture of the semiconductor device when the die on the semiconductor wafer 502 are not yet cut up into individual dice. In one embodiment of the present invention, characteristics of a fuse, a bonding pad, or a MRS decoder are set within the control signal generator 222 or 330 for indicating the logical state of the control signal(s) PS or X4, X8, and X16 for each semiconductor device on the semiconductor wafer 502 during the wafer stage.

Alternatively, the term "package stage" refers to a stage in the manufacture of the semiconductor device after the die on the semiconductor wafer 502 have been cut up into individual dice that is placed into a respective IC (integrated circuit) package 506. In another embodiment of the present invention, characteristics of a fuse, a bonding pad, or a MRS decoder are set within the control signal generator 222 or 330 for indicating the logical state of the control signal(s) PS or X4, X8, and X16 for the semiconductor device within the IC package 506 during the package stage.

Thus, characteristics of a fuse, a bonding pad, or a MRS decoder are set within the control signal generator 222 or 330 for indicating the logical state of the control signal(s) PS or X4, X8, and X16 during testing at the wafer stage or the package stage. As a result, the performance of the semiconductor device is enhanced before usual operation of the semiconductor device by a customer.

In this manner, the decoupling capacitance of the shared capacitor 202 is distributed among a plurality of voltage sources for enhanced performance of the semiconductor device such as a memory device. The foregoing is by way of example only and is not intended to be limiting. For example, any numbers of elements used herein such as the number of voltage sources and the number of shared capacitors are by way of example only.

In addition, the present invention has been described for application within a memory device such a DRAM (dynamic random access memory). However, the present invention may advantageously be applied for any other types of semiconductor devices.

The present invention is limited only as defined in the following claims and equivalents thereof.

The invention claimed is:

1. An apparatus for providing voltages, comprising:
a plurality of voltage sources, each coupled between respective high and low nodes, the high nodes including at least two distinct nodes, and the low nodes including at least two distinct nodes;
at least one shared capacitor; and
a switching network for coupling the shared capacitor to the respective high and low nodes for a selected one of the voltage sources.

2. The apparatus of claim 1, wherein each of the voltage sources has a respective initial decoupling capacitor coupled between the respective high and low nodes.

3. The apparatus of claim 1, wherein the shared capacitor and the switching network are formed as part of an integrated circuit.

4. The apparatus of claim 3, wherein the voltage sources are external to the integrated circuit.

5. The apparatus of claim 3, wherein the voltage sources are internal to the integrated circuit.

6. The apparatus of claim 3, wherein the integrated circuit is a memory device.

7. The apparatus of claim 1, wherein the switching network is comprised of a plurality of transistors that are each turned on or off with control signals.

8. The apparatus of claim 7, further comprising:
at least one fuse circuit for generating the control signals.

9. The apparatus of claim 8, wherein the shared capacitor and the switching network are part of an integrated circuit, and wherein a fuse within the fuse circuit is closed or opened for determining the selected one of the voltage sources during a wafer stage for manufacture of the integrated circuit.

10. The apparatus of claim 7, wherein the shared capacitor and the switching network are part of a memory device, and wherein the control signals are generated by a MRS (mode register set) decoder of the memory device.

11. The apparatus of claim 10, wherein a memory controller is programmed to provide signals to the MRS decoder for determining the selected one of the voltage sources during a wafer stage or a package stage for manufacturing the memory device.

12. The apparatus of claim 7, further comprising:
at least one bonding pad circuit for generating the control signals.

13. The apparatus of claim 12, wherein the shared capacitor and the switching network are part of an integrated circuit, and wherein at least one bonding pad is biased or floated for determining the selected one of the voltage sources during a wafer stage for manufacture of the integrated circuit.

14. An apparatus for providing voltages, comprising:
a data charge voltage source used for charging at least one output of a semiconductor device;
a plurality of shared decoupling capacitors; and
a switching network for coupling a variable number of the shared decoupling capacitors to the data charge voltage source depending on a bit organization of the semiconductor device.

15. The apparatus of claim 14, further comprising:
a plurality of voltage sources including the data charge voltage source, wherein each of the voltage sources has a respective initial decoupling capacitor coupled between respective high and low nodes.

16. The apparatus of claim 14, wherein the shared decoupling capacitor and the switching network are part of the semiconductor device.

17. The apparatus of claim 14, wherein the switching network is comprised of a plurality of transistors that are each turned on or off with control signals.

18. The apparatus of claim 17, further comprising:
at least one fuse circuit for generating the control signals.

19. The apparatus of claim 17, wherein the semiconductor device is a memory device, and wherein the control signals are generated by a MRS (mode register set) decoder of the memory device.

20. The apparatus of claim 17, further comprising:
at least one bonding pad circuit for generating the control signals.

21. An apparatus for distributing decoupling capacitance in a semiconductor device, comprising:
a plurality of voltage sources, each coupled between respective high and low nodes, the high nodes including at least two distinct nodes, and the low nodes including at least two distinct nodes;
at least one shared capacitor;
a switching network for coupling the shared capacitor to the respective high and low nodes of a selected one of a plurality of voltage sources; and
a control signal generator having a component that is set during a wafer stage or a package stage for manufacture of the semiconductor device for indicating the selected one of the voltage sources.

22. The apparatus of claim 21, wherein the control signal generator is a fuse circuit having a fuse that is closed or opened during the wafer stage for indicating the selected one of the voltage sources.

23. The apparatus of claim 21, wherein the control signal generator is a bonding pad circuit with a bonding pad that is biased or floated during the wafer stage for indicating the selected one of the voltage sources.

24. The apparatus of claim 21, wherein the semiconductor device is a memory device, and wherein the control signal generator is a MRS decoder that decodes signals from a memory controller for indicating the selected one of the voltage sources.

25. The apparatus of claim 24, wherein the signals for indicating the selected one of the voltage sources is programmed into the memory controller during the package stage.

26. The apparatus of claim 21, wherein one of the voltage sources is a data charge voltage source used for charging at least one output of the semiconductor device.

27. The apparatus of claim 26, further comprising:
a plurality of shared capacitors, wherein the switching network couples a variable number of the shared capacitors to the data charge voltage source depending on a bit organization of the semiconductor device.

28. The apparatus of claim 21, wherein the semiconductor device is a memory device.

29. The apparatus of claim 28, wherein one of the voltage sources is an external memory array voltage source (VDDA/VSSA) with the shared capacitor coupled thereto during a refresh operation of the memory device.

30. The apparatus of claim 28, wherein one of the voltage sources is an external memory array voltage source (VDDA/VSSA) with the shared capacitor coupled thereto during a PBT (parallel bit test) operation of the memory device.

31. The apparatus of claim 28, wherein one of the voltage sources is a delay locked loop voltage source (VDDL/VSSL) with the shared capacitor coupled thereto for synchronous data output of the memory device.

32. The apparatus of claim 28, wherein one of the voltage sources is a phase locked loop voltage source (VDDL/VSSL) with the shared capacitor coupled thereto for synchronous data output of the memory device.

33. The apparatus of claim 28, wherein one of the voltage sources is an internal memory array voltage source (VINTA/VSSA) with the shared capacitor coupled thereto during a refresh or parallel bit test of the memory device.

34. The apparatus of claim 28, wherein each of two of the voltage sources respectively provides an internal back bias voltage (VBB1/VSS) and an internal negative word-line voltage (VBB2/VSS) for the memory device.

35. The apparatus of claim 28, wherein each of two of the voltage sources respectively provides an internal word-line boosting voltage (VPP1/VSS) and an internal isolation and equalization gate voltage (VPP2/VSS) for the memory device.

* * * * *